(12) United States Patent
Bolouri-Saransar et al.

(10) Patent No.: US 12,712,526 B2
(45) Date of Patent: Aug. 18, 2026

(54) SYSTEMS, APPARATUSES, AND METHODS FOR SAFE COMMUNICATION AND DATA TRANSMISSION IN HIGH VOLTAGE POWER SYSTEMS

(71) Applicant: Panduit Corp., Tinley Park, IL (US)

(72) Inventors: Masud Bolouri-Saransar, Orland Park, IL (US); William W. Kidd, Shorewood, IL (US); Walid Balid, Orland Park, IL (US)

(73) Assignee: Panduit Corp., Tinley Park, IL (US)

( * ) Notice: Subject to any disclaimer, the term of this patent is extended or adjusted under 35 U.S.C. 154(b) by 575 days.

(21) Appl. No.: 18/197,440

(22) Filed: May 15, 2023

(65) Prior Publication Data

US 2023/0378805 A1 Nov. 23, 2023

Related U.S. Application Data

(60) Provisional application No. 63/344,920, filed on May 23, 2022.

(51) Int. Cl.
*H03K 3/01* (2006.01)
*H02H 1/00* (2006.01)
(Continued)

(52) U.S. Cl.
CPC ............ *H03K 3/01* (2013.01); *H02H 1/0007* (2013.01); *H02J 7/80* (2026.01); *H02J 7/933* (2026.01);
(Continued)

(58) Field of Classification Search
None
See application file for complete search history.

(56) References Cited

U.S. PATENT DOCUMENTS 6,784,790 B1 8/2004 Lester
8,781,637 B2 7/2014 Eaves
(Continued)

FOREIGN PATENT DOCUMENTS

CN 104617573 A 5/2015
CN 110829396 A 2/2020
(Continued)

OTHER PUBLICATIONS

Qin Lei, et al. "Unified Space Vector Pwm Control For Current Source Inverter", Energy Conversion Congress And Exposition (ECCE), 2012 IEEE, IEEE Sep. 15, 2012 (Sep. 15, 2012), pp. 4696-4702, XP032467013, DOI: 10.1109/ECCE.2012.6342181, ISBN: 978-1-4673-0802-1, Section III. Pulse-Width-Amplitude-Modulation (PWAM); figures 11,13,15.

*Primary Examiner* — Paul B Yanchus, III
(74) *Attorney, Agent, or Firm* — Peter S. Lee; Christopher S. Clancy; James H. Williams

(57) ABSTRACT

A high voltage pulse power delivery system is provided that includes dedicated safety features including fault detection and fault management. Alongside normal communications cabling, the pulse power delivery system provides remote power over standard multi-conductor cabling without dedicated conduit or separation. This simplifies installation of equipment, increases overall speed of deployment, and significantly reduces cost for deployment. The pulse power delivery system is further configured to transport power through a pulse current waveform.

9 Claims, 28 Drawing Sheets

| | Start Bits | Address | Payload (Bx : 10-bit Word) | CRC |
|---|---|---|---|---|
| Bits | 5 | 3+3' | 60+60' | 10+10' |
| Frame | S0S1S2S3S4 | A0A0'A1A1'A2A2' | W0W0'W1W1'W2W2'W3W3'W4W4'W5W5' | W6W6' |
| Total | 151 bits x 20µsec = 3.00ms | | | |

(51) Int. Cl.

| | |
|---|---|
| ***H02J 7/80*** | (2026.01) |
| ***H02J 7/90*** | (2026.01) |
| ***H02J 13/13*** | (2026.01) |
| ***H02M 1/00*** | (2006.01) |
| ***H02M 1/32*** | (2007.01) |
| ***H03K 4/94*** | (2006.01) |
| ***H04B 3/54*** | (2006.01) |

(52) U.S. Cl.

CPC ....... *H02J 13/1313* (2026.01); *H02M 1/0003* (2021.05); *H02M 1/32* (2013.01); *H03K 4/94* (2013.01); *H04B 3/54* (2013.01)

(56) References Cited

U.S. PATENT DOCUMENTS

| | | | |
|---|---|---|---|
| 8,880,917 | B2 | 11/2014 | Kreiner et al. |
| 9,184,795 | B2 | 11/2015 | Eaves |
| 9,419,436 | B2 | 8/2016 | Eaves et al. |
| 9,787,090 | B2 | 10/2017 | Hikihara et al. |
| 9,853,689 | B2 | 12/2017 | Eaves |
| 9,893,521 | B2 | 2/2018 | Lowe et al. |
| 10,374,423 | B2 | 8/2019 | Ibrahim et al. |
| 10,374,424 | B2 | 8/2019 | Zhyhinas et al. |
| 10,468,879 | B2 | 11/2019 | Eaves |
| 10,541,543 | B2 | 1/2020 | Eaves |
| 10,714,930 | B1 | 7/2020 | Weiss et al. |
| 10,735,105 | B2 | 8/2020 | Goergen et al. |
| 10,790,997 | B2 | 9/2020 | Jones et al. |
| 11,061,456 | B2 | 7/2021 | Jones et al. |
| 11,063,630 | B2 | 7/2021 | Arduini et al. |
| 11,258,520 | B2 | 2/2022 | Goergen et al. |
| 2002/0038154 | A1 | 3/2002 | Zimmermann et al. |
| 2002/0046276 | A1 | 4/2002 | Coffey et al. |
| 2012/0217808 | A1 | 8/2012 | Richardson et al. |
| 2014/0225436 | A1 | 8/2014 | Lester et al. |
| 2016/0034416 | A1 | 2/2016 | Chavez et al. |
| 2016/0294500 | A1 | 10/2016 | Chawgo et al. |
| 2016/0294568 | A1 | 10/2016 | Chawgo et al. |
| 2017/0279443 | A1 | 9/2017 | Morimoto |
| 2018/0313886 | A1 | 11/2018 | Mlyniec et al. |
| 2020/0020382 | A1 | 1/2020 | Stoneham |
| 2020/0096550 | A1* | 3/2020 | Goergen ................ G01R 31/58 |
| 2020/0235949 | A1 | 7/2020 | Jones et al. |
| 2020/0295559 | A1 | 9/2020 | Eaves et al. |
| 2020/0295955 | A1 | 9/2020 | O'Brien et al. |
| 2020/0389329 | A1 | 12/2020 | Jones et al. |
| 2021/0063447 | A1 | 3/2021 | Eaves |
| 2021/0075419 | A1 | 3/2021 | Manjrekar et al. |
| 2021/0167813 | A1 | 6/2021 | Arduini et al. |
| 2021/0167814 | A1 | 6/2021 | Arduini et al. |
| 2021/0273564 | A1 | 9/2021 | O'Brien et al. |
| 2021/0294402 | A1 | 9/2021 | Jones et al. |
| 2022/0116122 | A1 | 4/2022 | Goergen et al. |
| 2022/0116238 | A1 | 4/2022 | O'Brien et al. |
| 2022/0190587 | A1 | 6/2022 | Eaves et al. |

FOREIGN PATENT DOCUMENTS

| | | | |
|---|---|---|---|
| EP | 2282616 | A1 | 2/2011 |
| EP | 2432134 | A1 | 3/2012 |
| EP | 3726719 | A1 | 10/2020 |
| EP | 3414808 | B1 | 5/2022 |
| JP | 2005020873 | A | 1/2005 |
| JP | 2007018581 | A | 1/2007 |
| WO | 2019171271 | A1 | 9/2019 |
| WO | 2021092350 | A1 | 5/2021 |

* cited by examiner

| | Start Bits | Address | Payload (Bx : 10-bit Word) | CRC |
|---|---|---|---|---|
| Bits | 5 | 3+3' | 60+60' | 10+10' |
| Frame | S0S1S2S3S4 | A0A0'A1A1'A2A2' | W0W0'W1W1'W2W2'W3W3'W4W4'W5W5' | W6W6' |
| Total | 151 bits x 20µsec = 3.00ms | | | |

SYSTEMS, APPARATUSES, AND METHODS FOR SAFE COMMUNICATION AND DATA TRANSMISSION IN HIGH VOLTAGE POWER SYSTEMS

CROSS-REFERENCE TO RELATED APPLICATION(S)

This application claims benefit to U.S. Provisional Patent Application No. 63/344,920, filed May 23, 2022, the entirety of which is incorporated by reference herein.

FIELD OF TECHNOLOGY

The present disclosure describes systems and methods relating to the technological field of high voltage power supply and safe power management and utilization for such high voltage power systems. The high voltage power systems may, for example, be in the field of Class 4 Fault Managed Power Distribution Systems, as described in more detail herein.

BACKGROUND

Effective power delivery systems for controlled environments (e.g., networked equipment within a building) are becoming more common. However, the designs and capabilities of existing power delivery systems are often times inadequate for their desired use. For example, they may not be able to provide adequate power, or they may not be able to effectively reach remote locations.

Furthermore, the existing systems have high equipment and installation costs, while also oftentimes being non-compliant with power or safety requirements and being non-durable.

SUMMARY

A high voltage power delivery system is disclosed, the system comprising a first pulser device configured to transmit a first pulse power signal on a first transmission line, a second pulser device configured to transmit a second pulse power signal on a second transmission line, wherein the second pulse power signal is synchronized to the first pulse power signal, and a third pulser device configured to transmit a third pulse power signal on a third transmission line, wherein the third pulse power signal is synchronized to the second pulse power signal.

A high voltage power delivery system is disclosed, the system comprising: an RF communication unit configured to transmit a data packet stream over a transmission line, wherein the data packet stream comprises a plurality of data packets, and wherein the transmission line is also configured to transmit a pulse power signal, and apply a bit error correction to the data packet stream as the data packet stream is transmitted over the first transmission line.

DETAILED DESCRIPTION

The methods, devices, systems, and other features discussed below may be embodied in a number of different forms. Not all of the depicted components may be required, however, and some implementations may include additional, different, or fewer components from those expressly described in this disclosure. Variations in the arrangement and type of the components may be made without departing from the spirit or scope of the solution as set forth herein. Further, variations in the processes described, including the addition, deletion, or rearranging an order of operations, may be made without departing from the spirit or scope of the solution as set forth herein.

This disclosure describes embodiments of a pulse power delivery system that includes dedicated safety features including fault detection and fault management. Wireless systems are installed in a variety of locations and venues. An exemplary pulse power delivery system provides a remote power delivery solution that helps wireless system integrators design and deploy wireless systems. This solution may be ideal for larger venues or complex installations that require centralized power that is cost efficient, safe, easy to install, and can reach further distances. In this way, the pulse power delivery system may be configured to remotely power electrical devices such as remote radios, small cells, security cameras, access controls, as well as indoor and outdoor Distributed Antenna Systems (DAS).

Easy to install and designed for wireless solutions, the pulse power delivery system uses wiring methods afforded to communications wiring per NEC (National Electrical Code) guidelines. Alongside normal communications cabling, the pulse power delivery system may provide remote power over standard multi-conductor cabling without dedicated conduit or separation. This simplifies installation of equipment, increases overall speed of deployment, and significantly reduces cost for deployment. The pulse power delivery system is further configured to transport power through a pulse current waveform (note, the pulse power signal may alternatively be referenced as a pulse current signal). The pulse power delivery system also includes a fault prevention method that further improves its safety characteristics, as will be described in more detail herein.

Figure 1:
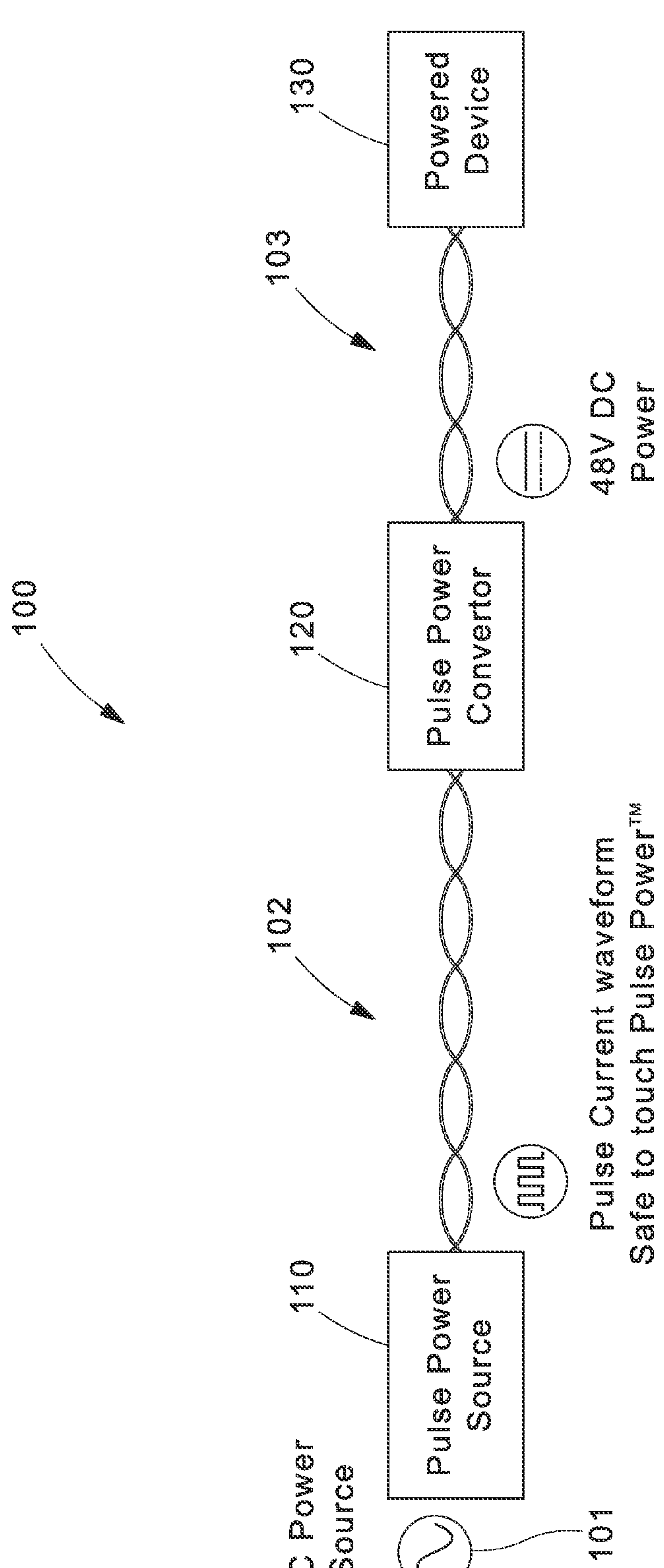
FIG. 1 illustrates a block diagram of an exemplary pulse power delivery system, according to some embodiments.

FIG. 1 illustrates a simplified system diagram that shows device components that may be included in an exemplary pulse power delivery system 100. A pulse power source 110 is configured to receive standard AC power (e.g., 110/220V outlets or 208V source from a rack-PDU), then the pulse power source 110 converts the received standard AC power into a higher voltage, limited current, DC power (e.g., 360 V, up to 400V, or higher voltage according to some embodiments). From the pulse power source 110, power is transmitted in a pulse current waveform through a multi-conductor cable power transmission line 102, to be received by the pulse power converter 120. The pulse power converter 120 is configured to convert the received pulse power into end-device usable power (e.g., 48V DC power). The pulse power converter 120 is typically distributed throughout a building near one or more end-device loads that require the power for operation.

Figure 2:
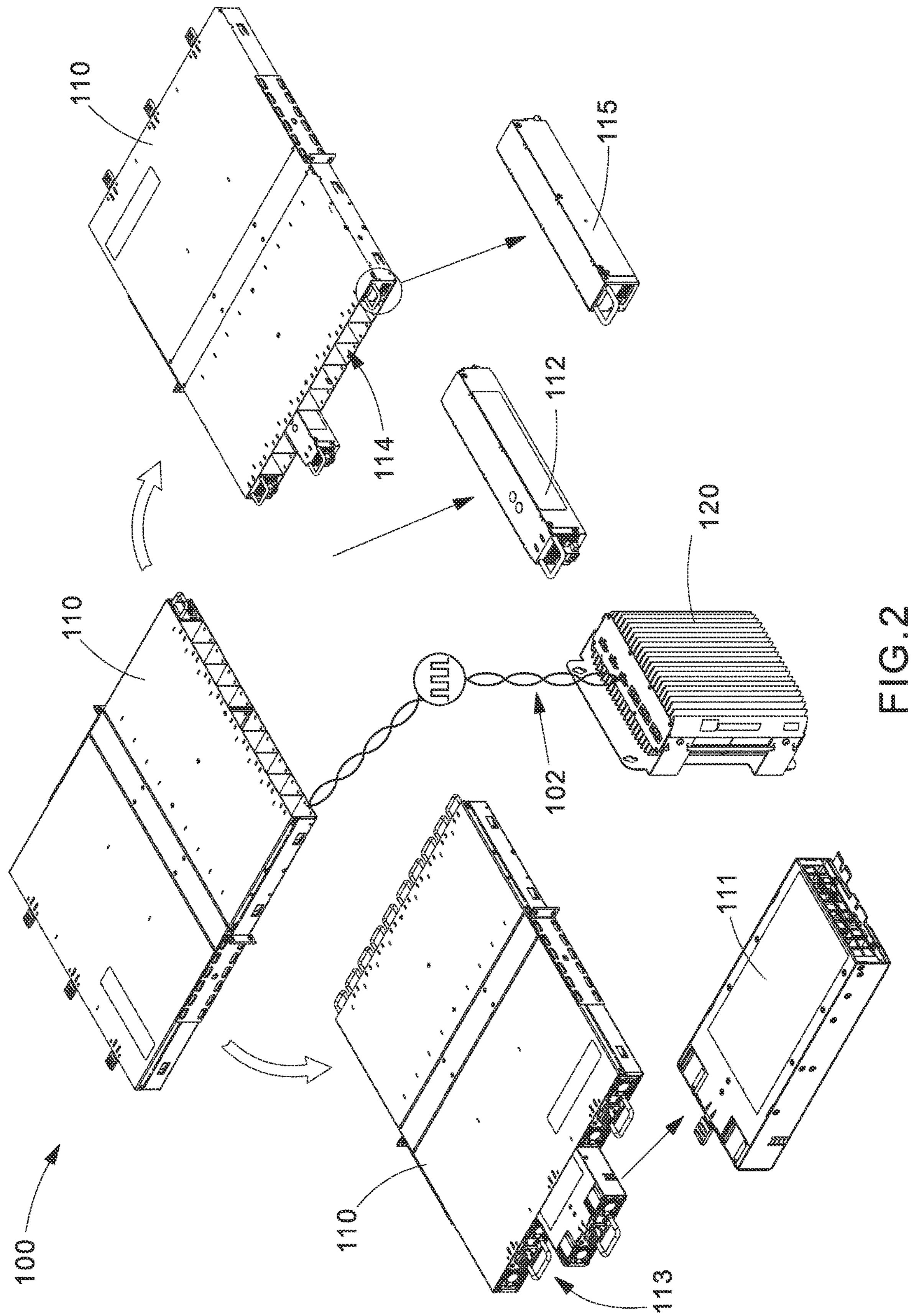
FIG. 2 illustrates a product-level diagram showing exemplary components that may be included in the pulse power delivery system shown in FIG. 1, according to some embodiments.

FIG. 2 illustrates a more detailed system diagram showing exemplary device components in the pulse power source 110 and how it communicates with the pulse power converter 120 in the pulse power delivery system 100. As shown in FIG. 2, the pulse power source 110 may include a chassis for holding one or more power supply modules 111, one or more pulser modules 112, and one or more management cards 115. The management card 115 may include a processor, as well as software, hardware, middleware, and/or circuitry for implementing any one or more of the features described herein.

A rear side of the pulse power source 110 includes one or more openings 113 (e.g., three openings) for installing a respective power supply module 111, and a front side of the pulse power source 110 includes one or more openings 114 (e.g., nine openings) for installing a respective pulser module 112. The front side also includes an opening for installing the management card 115. Within the pulse power source 110, the power supply module 111 is configured to receive standard AC power, convert it into the higher voltage, and then transmit it to the pulser modules 112, where the pulser modules 112 are configured to pulse this high voltage power according to a pulsing scheme, and transmit it across the transmission line 102 to the pulse power converter 120.

After receiving the high voltage pulse power, the pulse power converter 120 is configured to convert this down into a device usable voltage (e.g., 48V DC power) and deliver it to one or more end-devices. The pulser module 112 is coupled to the transmission line 102 to monitor the voltage/power being transmitted over the transmission line, where the pulser module 112 is configured to control one or more of the fault management safety features of the pulse power delivery system 100 described herein.

The pulse power delivery system 100 may, for example, be an implementation of an NEC Class 4 power distribution system capable of supplying up to 400V for a limited period (e.g., ON-TIME period) followed by a period of time (e.g., OFF-TIME) where a much-reduced voltage is supplied. The reduced voltage that is supplied during this OFF-TIME may be a predetermined voltage (e.g., less than around 60V) with a limited current capability. The ON-TIME period and OFF-TIME period are typically in the range of milliseconds, where the ON-TIME period may be greater than the OFF-TIME period (e.g., 2 ms ON-TIME, 1 ms OFF-TIME), the ON-TIME period may be less than the OFF-TIME period (e.g., 1 ms ON-TIME, 2 ms OFF-TIME), or the ON-TIME period may be substantially the same as the OFF-TIME period (e.g., 2 ms ON-TIME, 2 ms OFF-TIME).

Figure 3:
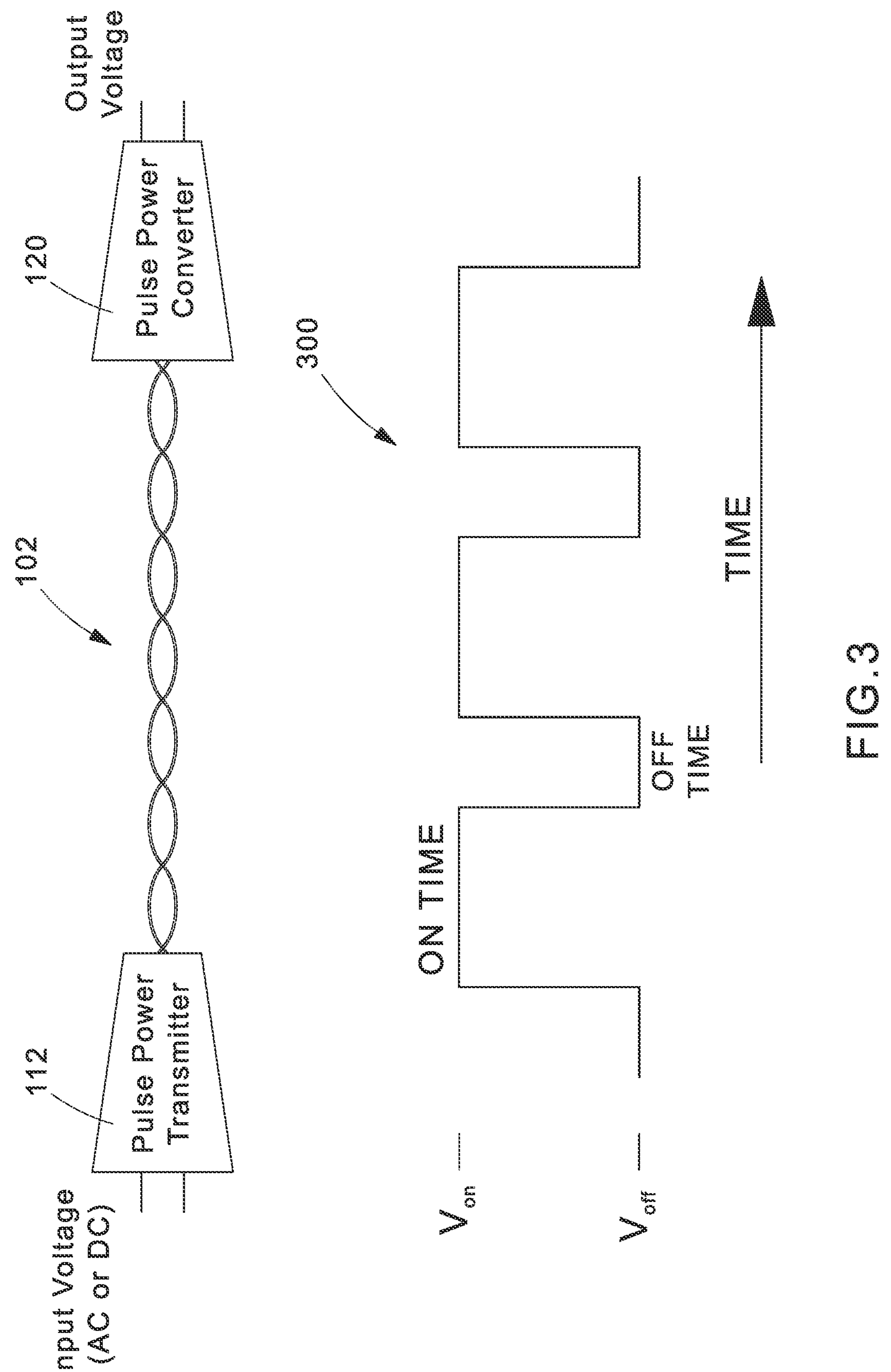
FIG. 3 illustrates a chart mapping an exemplary voltage on-off cycle that may be implemented in the pulse power delivery system, according to some embodiments.

The OFF-TIME period may be utilized to determine an un-safe situation in the pulse power delivery system. In the case where an un-safe condition is detected, the circuit will prevent turning on the power to the line. For example, FIG. 3 shows a voltage chart 300 depicting an exemplary voltage value for a pulse power signal being transmitted over time by the pulser module 112 via the transmission line 102, where this pulse power signal is being received by the pulse power converter 120. In the voltage chart 300 shown in FIG. 3, the ON-TIME during which the voltage is ON (e.g., $V_{ON}$) is longer than the OFF-TIME where the voltage is OFF (e.g., $V_{OFF}$). However, according to other embodiments the ON-TIME where the voltage is ON (e.g., $V_{ON}$) may be the same, or shorter, than the OFF-TIME where the voltage is OFF (e.g., $V_{OFF}$).

Figure 4A:
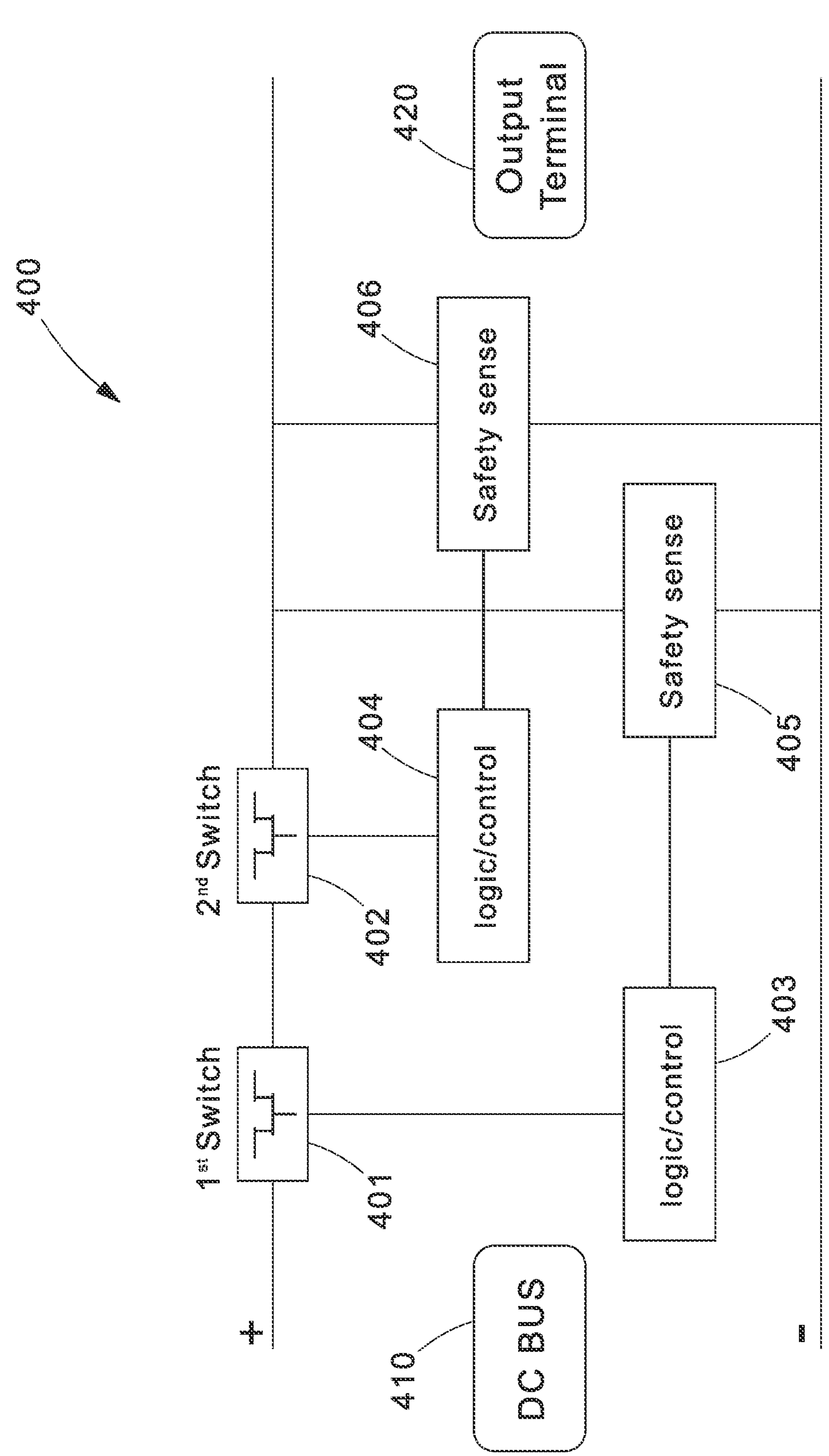
FIG. 4A illustrates a circuit diagram of an exemplary safety detection circuit that may be included in the pulse power delivery system, according to some embodiments.

To implement the safety fault detection in the pulse power delivery system 100, a safety circuitry is included. For example, FIG. 4A shows an exemplary system diagram of a safety circuitry 400 that may be included in the pulser module 112. The safety circuitry 400 is configured to include both a detection circuit and a prevention circuit, where the detection circuit and the prevention circuit are separate and independent from each other. Keeping these two circuits independent helps improve the reliability (e.g., the Functional Safety Failure in Time (FIT) rate) of the safety circuitry 400, and also ensures a fail-safe operation of the safety circuitry 400. Furthermore, to improve the FIT rate of the safety circuitry 400 the only inputs to the safety circuitry 400 are the transmission line. The safety circuitry 400 is further designed to utilize discrete components (e.g., no programmable devices used) to improve its reliability.

The safety circuitry 400 includes a high-voltage DC input 410 generated by a power supply module 111. The safety circuitry 400 also includes an output terminal 420 that is coupled to the transmission line 102. The safety circuitry 400 also includes a first switch 401 (e.g., current profile switch) that is coupled to a first logic/control circuitry 403 and a first safety sense circuitry 405. The safety circuitry 400 also includes a second switch 402 (e.g., power switch) that is coupled to a second logic/control circuitry 404 and a second safety sense circuitry 406.

Figure 4B:
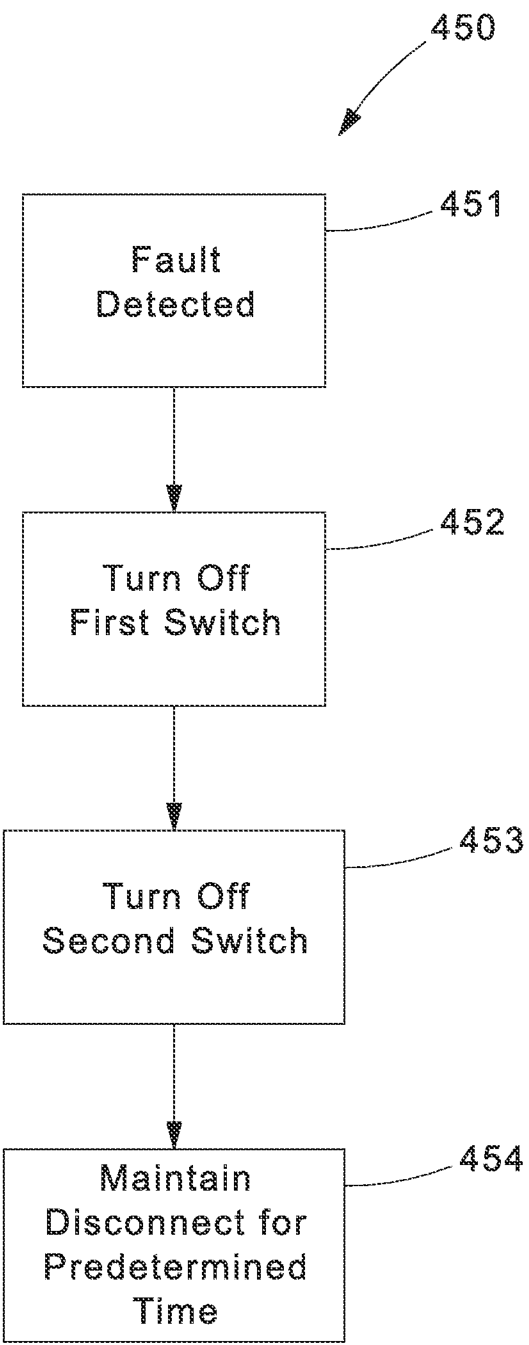
FIG. 4B illustrates a flow chart describing an exemplary fault detection and safety procedure using the safety detection circuit shown in FIG. 4A, according to some embodiments.

FIG. 4B shows a flow chart 450 describing an exemplary fault detection process that may be implemented by the pulser module 112 using the safety circuitry 400. At 451, a fault may be detected. The fault detection 451 may occur during a start-up initialization step of the pulse power delivery system 100. In addition or alternatively, the fault detection 451 may occur following some normal operational time of the pulse power delivery system 100. The fault detection 451 may correspond to a fault condition that includes, for example but not limited to, a person touching the transmission line 102, a load that was receiving the pulse power being disconnected during pulse power transmission, an over voltage condition being detected, an ON-TIME period being detected to being too long, an OFF-TIME period being detected to being too short, and/or spurious ON voltage sensing (e.g., detection of a voltage turning on at the output terminals not as a result of the control system intentionally turning on).

At 452, the power path is disconnected by turning off the first switch 401.

At 453, the power path is disconnected by turning off the second switch 402.

At 454, the disconnected power paths are maintained by keeping the first switch 401 and the second switch 402 open (i.e., turned off) for a predetermined length of time following the detection of the fault condition. For example, the predetermined time may be a minimum of at least 5 seconds.

Following the predetermined length of time, the power path may be reestablished. Alternatively, according to some embodiments an additional verification step may be implemented before the power path is reestablished.

Figure 5A:
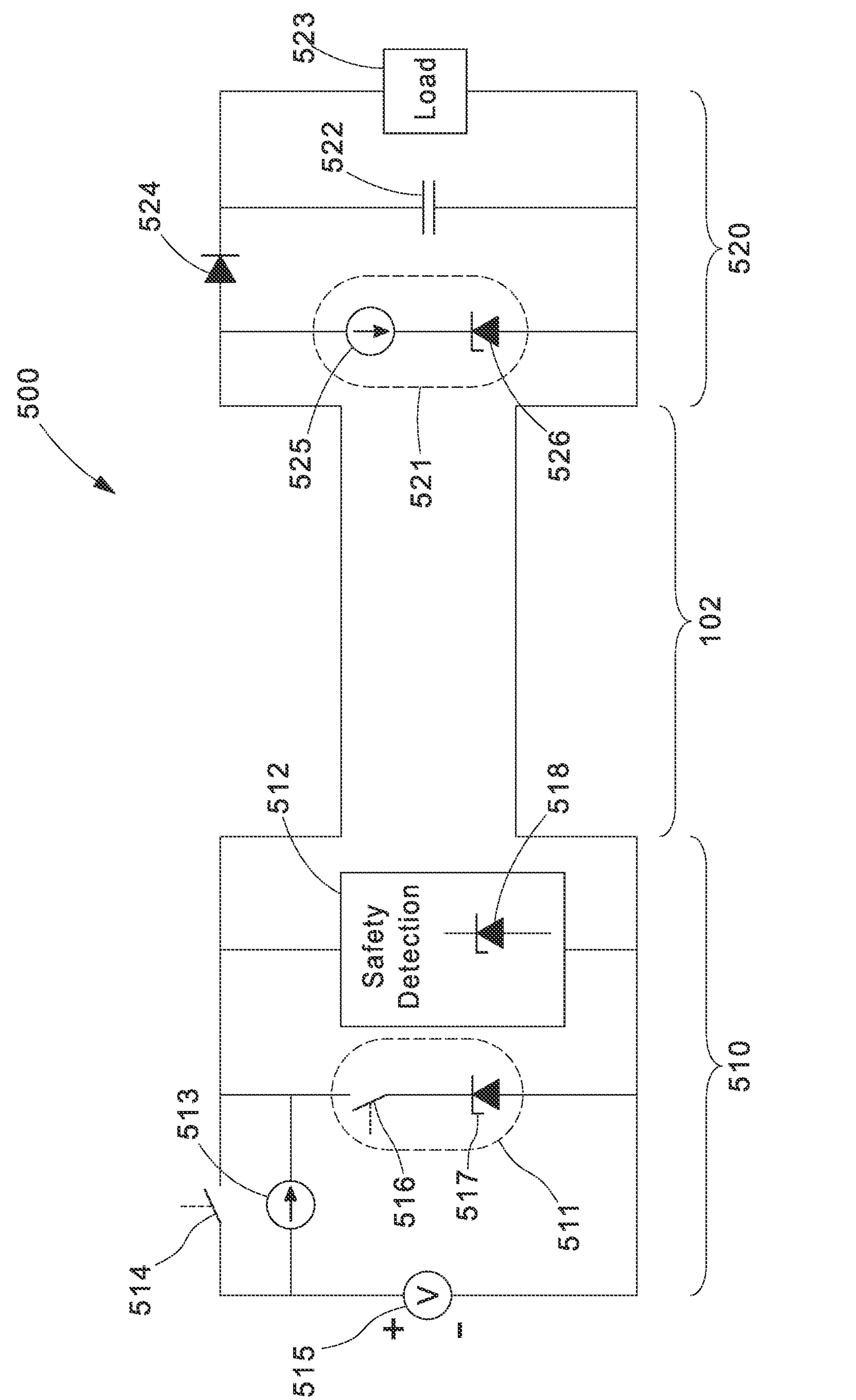
FIG. 5A illustrates an exemplary circuit diagram of the pulse power delivery system, according to some embodiments.

FIG. 5A shows an exemplary system diagram that includes components of a pulse power delivery system 500 including a safety detection circuit 512, according to some embodiments. The pulse power delivery system 500 includes a pulse power pulser module 510, a pulse power converter module 520, and a transmission line 102 connecting the two system components. In FIG. 5A, the component devices included in the pulse power delivery system 500 may be a system architecture representation of the same components shown to be included in the pulse power delivery system 100.

The pulse power pulser module 510 includes a safety detection circuit 512, where the safety detection circuit 512 may be a higher level system representation of certain components of the safety circuitry 400 shown in FIG. 4A. The safety detection circuit 512 includes a circuitry component 518 (e.g., a zener diode or window voltage comparator), where the safety detection circuit 512 may be configured to detect a change in voltage across the transmission line 102 and/or detect a change to the characteristic impedance of the transmission line 102.

The pulse power pulser module 510 further includes a first switch 514 (e.g., the first switch 514 may be a representation of the first switch 401 and the second switch 402 included in the safety circuitry 400 shown in FIG. 4A), a current source 513 that is connected in parallel to the switch 514, a second switch 516, a circuitry component 517 (e.g, zener diode or window voltage comparator), and the safety detection circuit 512. The second switch 516 and the circuitry component 517 together make up a discharger circuit 511. The discharger circuit 511 discharges the transmission line 102 to a safe voltage during the OFF-TIME, during which the transmission line 102 is checked for any faults. The safe voltage on the transmission line 102 during the OFF-TIME is regulated by the current source 513 and the load detection circuit 521 included in the pulse power converter module 520, as described in more detail below.

Included in the pulse power converter module 520, a current source 525 and a circuitry component 526 (e.g., zener diode or window voltage comparator) together make up a load detection circuit 521. The load detection circuit 521 provides a constant current drop on the transmission line 102 during the OFF-TIME. If the pulse power converter module 520 is not connected to the transmission line 102, the voltage will not be regulated to a pre-define threshold. In this case, the pulse power pulser module 510 will not detect the pulse power converter module 520 during initialization or will detect a disconnected state for the pulse power converter module 520 during a normal operation. In both cases, the load detection circuit 521 will disconnect the high voltage and put the transmission line 102 into a safe state until the pulse power converter module 520 is detected.

The voltage on the transmission line 102 line during initialization or the OFF-TIME is regulated by the current source 513 (on the pulse power pulser module 510) and the load detection circuit 521 (on the pulse power converter module 520). The load detection circuit 521 regulates the transmission line 102 to a safe voltage by either dynamically changing the load resistor or by using the circuitry component 526. The load detection circuit 521 is coupled to a diode 524, and is further in parallel to a capacitor 522, which is in parallel to a load device 523, where the load device 523 is the end device configured to receive the pulse power in the pulse power delivery system 500. The combination of the capacitor 522 and the diode 524 serves as a pulse rectifier, which provides the DC Bus voltage to the load.

Figure 5B:
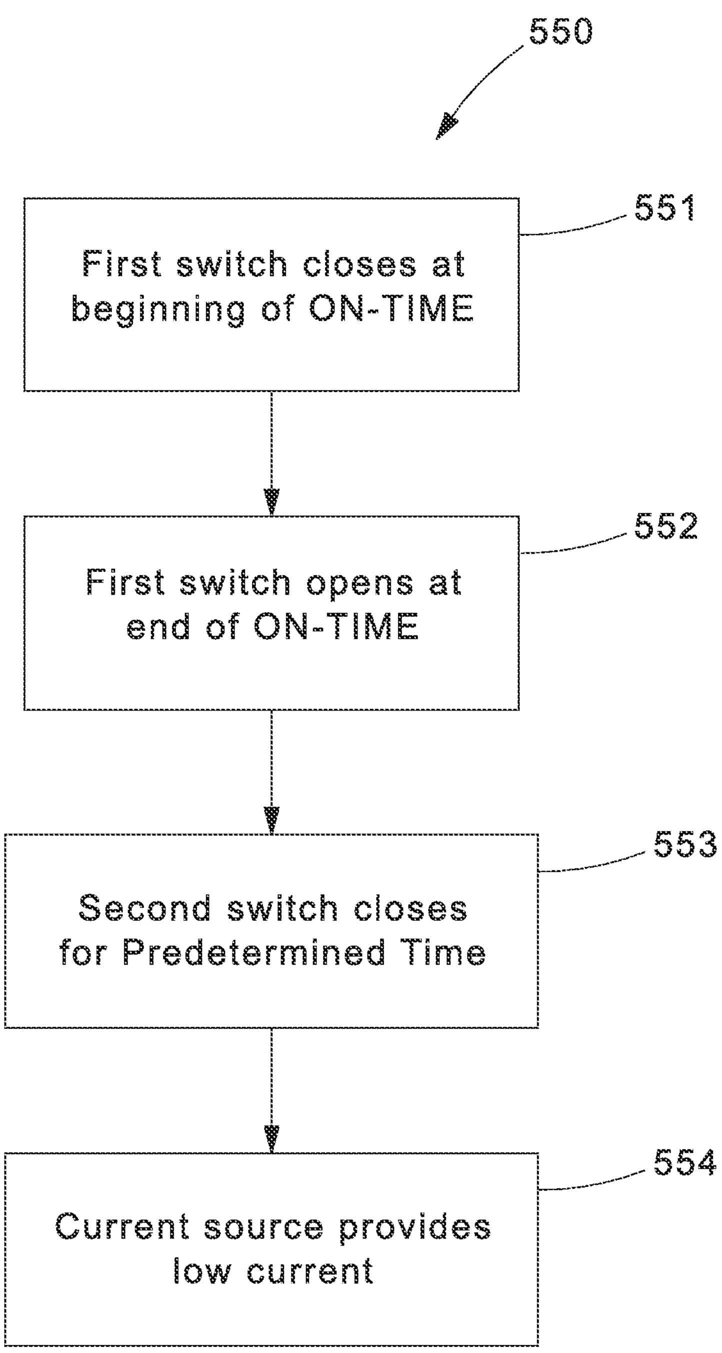
FIG. 5B illustrates a flow chart describing an exemplary circuit operation procedure that may be implemented during a power delivery process using the circuits from the pulse power delivery system shown in FIG. 5A, according to some embodiments.

FIG. 5B shows a flow chart 550 describing an exemplary circuit operation procedure during a power delivery process, where the power is being transmitted according to a process controlled by the pulser module 112 using the safety detection circuit 512.

At 551, the first switch 514 closes at the beginning of an ON-TIME period to provide power from the power supply 515. This power is supplied to the load device 523 through the diode 524.

At 552, the first switch 514 opens at the end of the ON-TIME period, effectively shutting down the power being transmitted over the transmission line 102. The diode 524 operates to block a reverse DC current from feeding back to the transmission line 102 from the capacitor 522 on the side of the pulse power converter module 520.

At 553, the second switch 516 in the discharger circuit 511 is closed for a predetermined length of time (e.g., a short amount of time that may, for example, be determined by the maximum capacity of the transmission line 102). By closing the second switch 516, this reduces the residual voltage on the transmission line 102 to a safe voltage level defined by the reference voltage across the circuitry component 517 in the discharger circuit 511.

At 554, the current source 513 supplies a low current to the transmission line 102. The low current may be, for example, 2 mA. Alternatively, according to some embodiments the low current may be lower than 2 mA, slightly greater than 2 mA, or within a range of predetermined low currents. The current source 525 included in the load detection circuit 521 provides a path to hold/regulate the residual line voltage to a value defined by the circuitry component 526 in the load detection circuit 521. According to a first example, the load detection circuit 521 implements a current sink as a load that draws current from the transmission line 102 as long as the voltage is above the value defined by the circuitry component 526 to keep the line voltage around the voltage value of the circuitry component 526. According to a second example, the load detection circuit 521 implements a controlled current sink as a load and an analog window comparator that compares the line voltage to a reference voltage and switches the controlled current sink to maintain the line voltage within a predetermined window.

Figure 6:
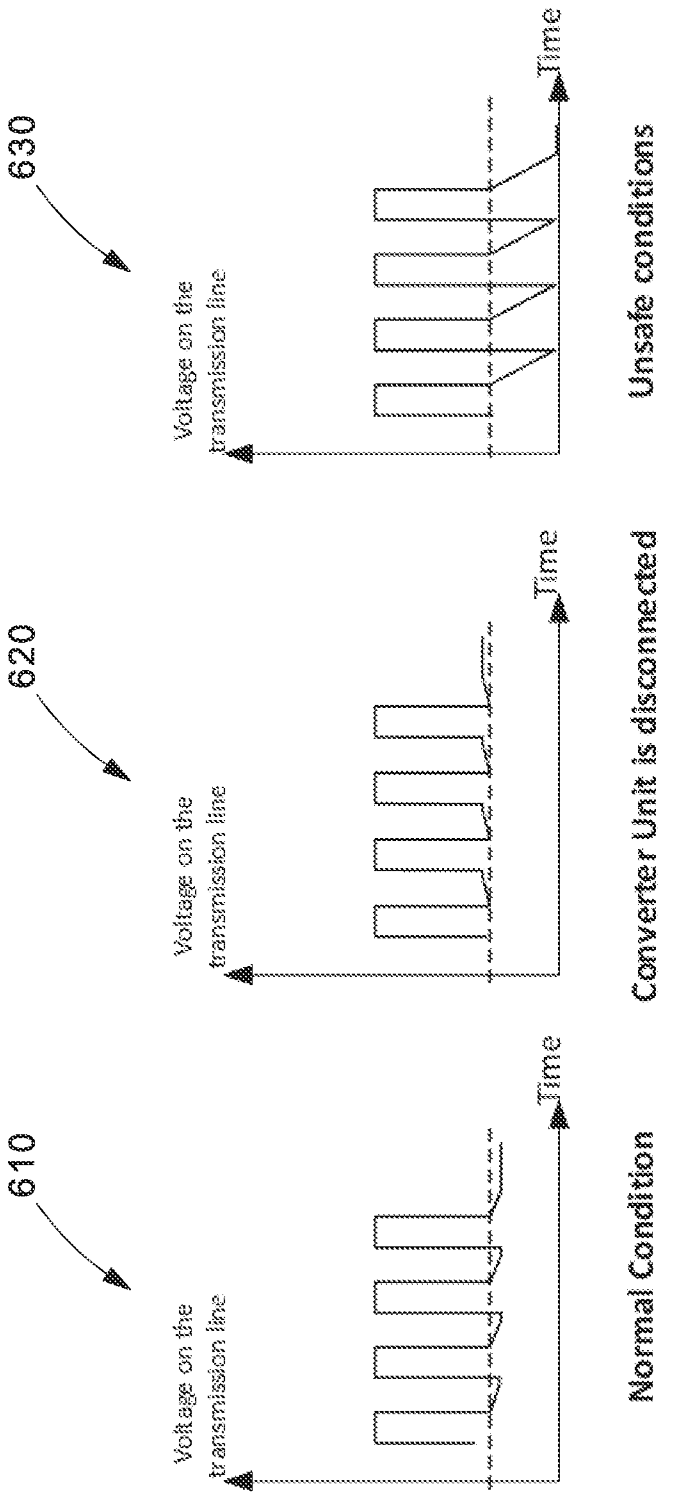
FIG. 6 illustrates voltage level graphs depicting different exemplary safety conditions that may occur while operating the pulse power delivery system, according to some embodiments.

FIG. 6 shows three exemplary graphs 610, 620, 630 that portray three different scenarios that may occur on the transmission line 102 and be handled by the safety detection circuit 512.

The first graph 610 portrays a normal condition where at the end of the OFF-TIME period the line voltage detected on the transmission line 102 should be around the voltage set across circuitry component 526 (e.g., zener diode).

The second graph 620 portrays a disconnected condition where at the end of the OFF-TIME period the line voltage detected on the transmission line 102 will be higher than the voltage across circuitry component 517 (e.g., zener diode or window voltage comparator).

The third graph 630 portrays an unsafe condition where at the end of the OFF-TIME period the line voltage detected on the transmission line 102 will be lower than the voltage across circuitry component 518 (e.g., zener diode or window voltage comparator).

Figure 7:
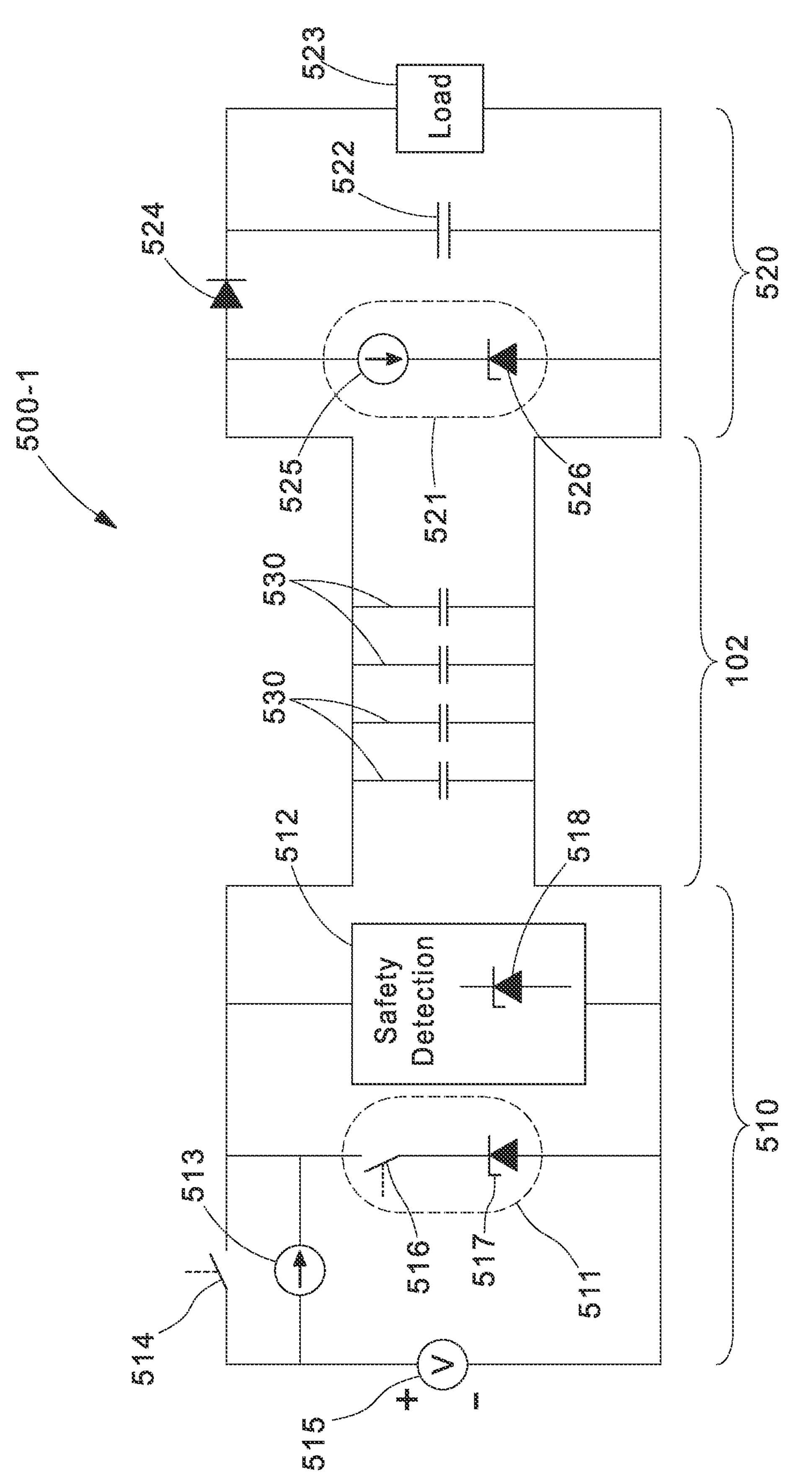
FIG. 7 illustrates an exemplary circuit diagram of the pulse power delivery system, according to some embodiments.

FIG. 7 shows an exemplary system diagram for a pulse power delivery system 500-1, where the components in the pulse power deliver system 500-1 are the same as shown for pulse power deliver system 500, except for a number of parasitic capacitance elements 530 that are found on the transmission line 102 in the embodiments described by the pulse power deliver system 500-1. The parasitic capacitance elements 530 are represented by capacitors, but may be representative of other circuitry components that impart parasitic capacitance characteristics in other embodiments.

The parasitic capacitance elements 530 are shown to be representative of undesirable elements that may be found on the transmission line 102 in the pulse power delivery system 500-1, and also provide an opportunity to describe how such undesirable elements may be addressed by the safety detection circuit 512 in the pulse power delivery system 500-1. In essence, the pulse power delivery system 500-1 is designed so that the parasitic capacitance elements 530 do not change operation of the safety detection circuit 512.

Figure 8:
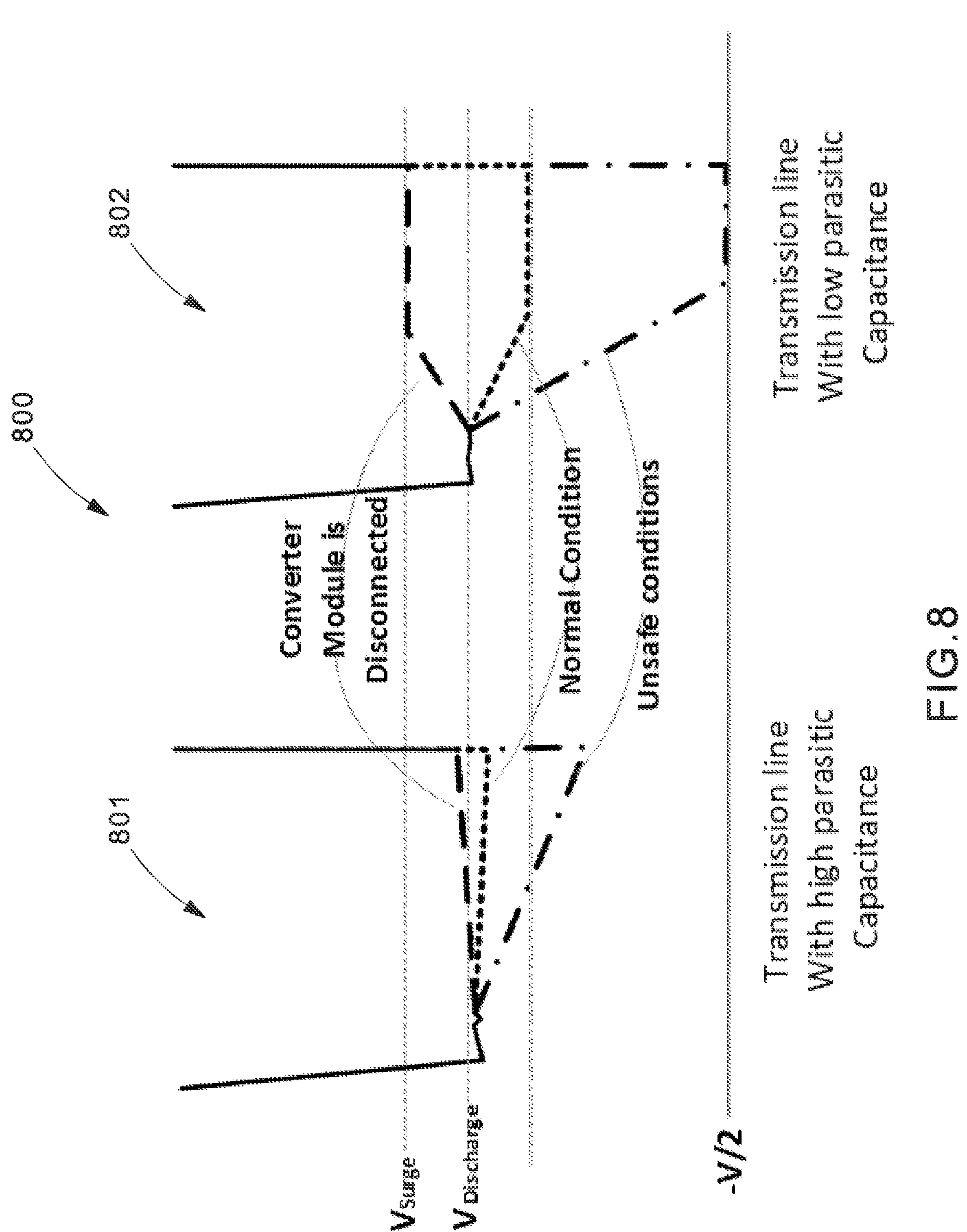
FIG. 8 illustrates a voltage graph depicting certain exemplary voltage characteristics that may occur while operating the pulse power delivery system, according to some embodiments.

For example, FIG. 8 shows a voltage graph 800 that includes a first voltage plot 801 and a second voltage plot 802. The first voltage plot 801 depicts the voltage characteristics for a first transmission line having a high parasitic capacitance, while the second voltage plot 802 depicts the voltage characteristics for a second transmission line having a low parasitic capacitance.

In the first voltage plot 801 representing the first transmission line with high parasitic capacitance, under normal conditions the voltage is seen to drop slightly below the discharge voltage, $V_{discharge}$, then under unsafe conditions the voltage is seen to drop noticeably below the discharge voltage $V_{discharge}$, and under the condition where the pulse power converter module 520 is disconnected (i.e., another type of fault condition) the voltage is seen to rise slightly above the discharge voltage $V_{discharge}$. In the second voltage plot 802 representing the second transmission line with low parasitic capacitance, under normal conditions the voltage is seen to drop noticeably below the discharge voltage, $V_{discharge}$, then under unsafe conditions the voltage is seen to drop significantly below the discharge voltage $V_{discharge}$ to a level marked as −V/2, and under the condition where the pulse power converter module 520 is disconnected (i.e., another type of fault condition) the voltage is seen to rise noticeably above the discharge voltage $V_{discharge}$ to a level marked as a surge voltage $V_{surge}$. It follows that the pulse power delivery system 500 is able to establish the threshold limits in a way that parasitic capacitance found on the transmission line 102 will not change the operation of the safety detection mechanisms of the safety detection circuit 512. The voltage threshold limits are set, for example, by the discharge levels defined by the circuitry component 517 and the current source 513 and the window voltage comparator in the circuitry component 526.

For purposes of this disclosure, the following definitions may be used:

"Touch"—detection of voltage drops below a defined threshold during the OFF-Time period.

"Disconnected"—detection of voltage increases above a defined threshold during the OFF-Time period.

"Over Voltage"—detection of excessive voltage across the output terminals during the ON Time period.

"ON Timing"—detection of the ON-Time period sensed across the output terminals is determined to be too long.

"OFF Timing"—detection of the OFF-Time period sensed across the output terminals is determined to be too short or too long.

"ON sense"—detection of a voltage turning on at the output terminals that is not caused by the control system turning on.

FIGS. 9-13 illustrate exemplary circuit diagrams that may be included in the pulser modules 112 for generating some of the critical signals that are used during operation. These signals are generated from relying on output line statuses and will be used in various parts of the safety detection circuit 512.

Figure 9:
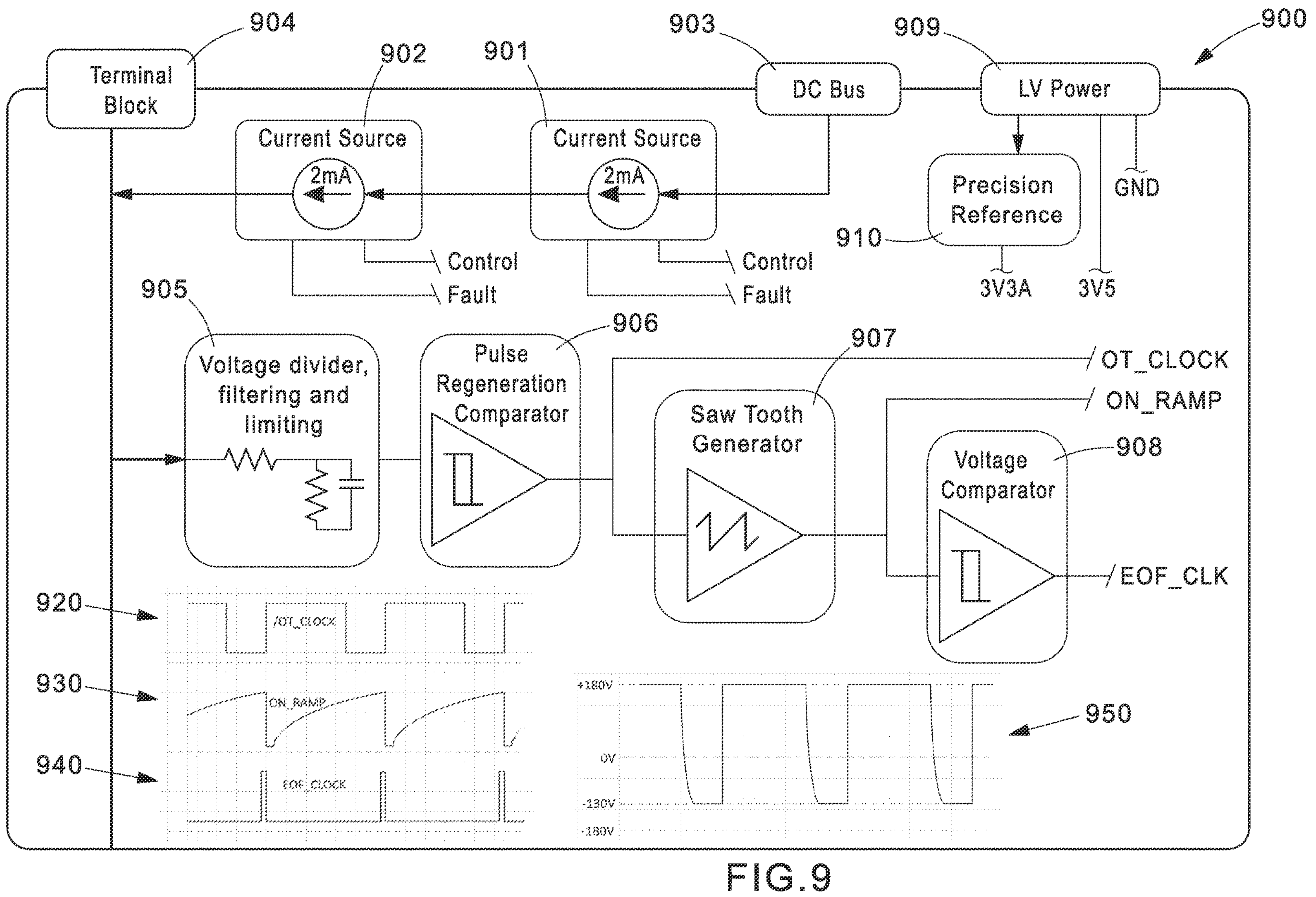
FIG. 9 illustrates an exemplary circuit diagram that may be included in the pulse power delivery system for clock recovery, ramp generation, cascaded and energy limited current source, according to some embodiments.

FIG. 9 illustrates an exemplary circuit diagram of a circuit 900 that may be included in the pulser modules 112. The circuit 900 includes component and/or mechanisms for preventing a single component failure from causing an un-safe condition that may be included in the pulser modules 112.

The circuit 900 includes a first current source 901 and a second current source 902, where the first current source 901 and the second current source 902 are configured in a two-stage, cascaded, configuration to prevent a single component failure from causing an un-safe condition. Each of the first current source 901 and the second current source 902 may be 2 mA current sources. The first current source 901 is coupled to an input to a DC bus 903, and an output to the second current source 902 is coupled to a terminal block 904 as well as to a series of circuit components including an voltage conditioning and sensing component 905, a pulse regeneration component 906, a sawtooth generator component 907, and an end of OFF-TIME clock generator component 908. Each of the first current source 901 or the second current source 902 may be disabled from providing current, that is controlled by the independent safety detection circuits in the pulser module 112.

Specifically, the voltage conditioning and sensing component 905 is configured to convert the Line high voltage to voltage levels compatible with electronic logic components (e.g., sensing components).

The pulse regeneration component 906 together with the sawtooth generator component 907 work as comparator circuits, and are configured to re-create the ON-TIME switching signal (OT_CLOCK) and the ON-TIME Ramping Signal (ON_RAMP) from the transmission line.

Figure 10:
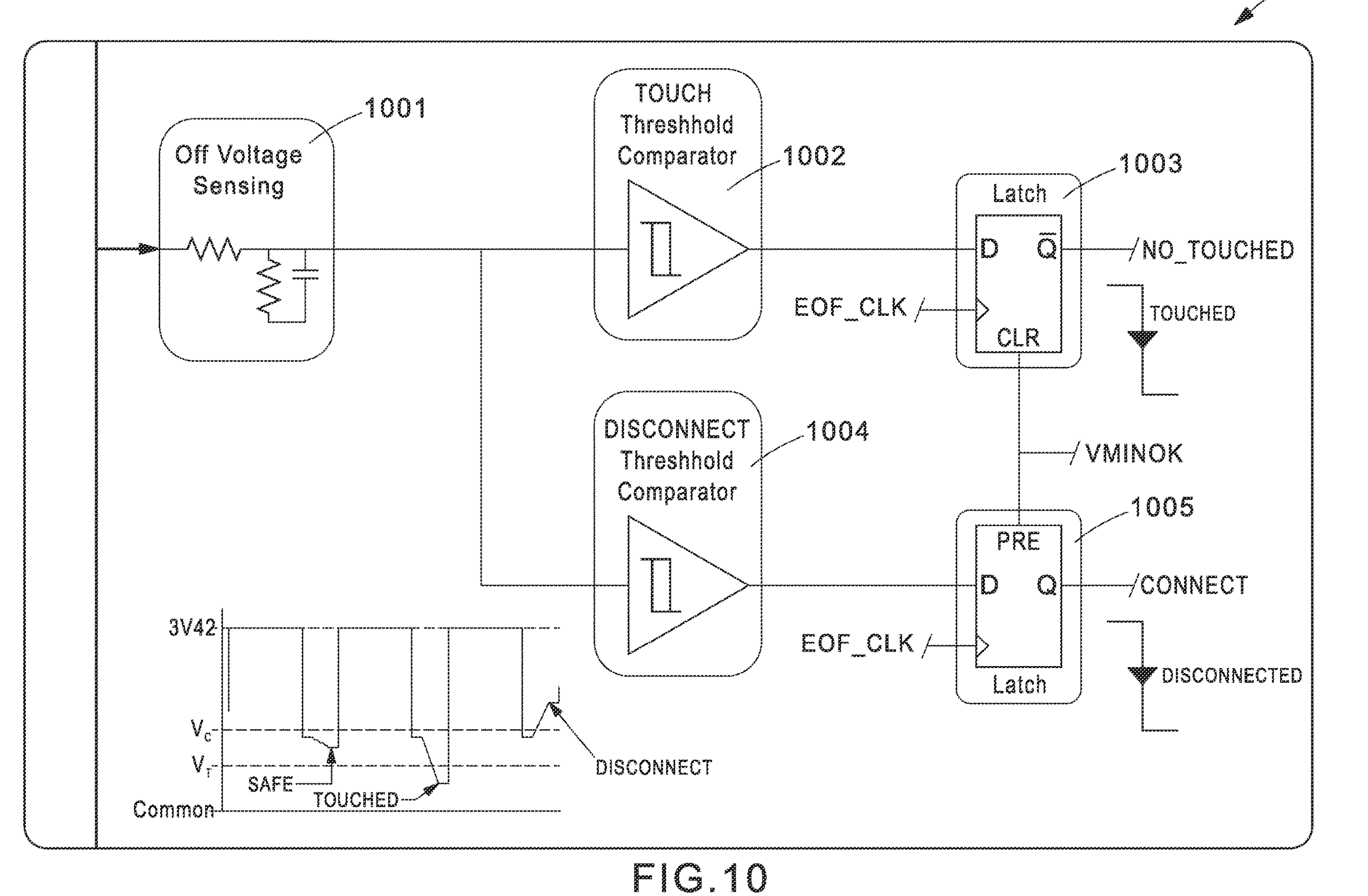
FIG. 10 illustrates a circuit diagram of an exemplary circuit that may be included in the pulse power delivery system for detecting fault conditions, according to some embodiments.

The end of OFF-TIME clock generator component 908 is configured to generate a pulse EOF_CLK at the end of the OFF-TIME period which is used by fault detection logic latches 1003 and 1005 (shown in FIG. 10).

FIG. 10 illustrates an exemplary circuit diagram of a circuit 1000 that may be included in the pulser modules 112. The circuit 1000 includes components and/or mechanisms that are utilized to detect unsafe conditions and generate a detection signal when a "Touch" or a "Disconnected" scenario is detected on the transmission line 102.

The circuit 1000 includes an off-voltage sensing component 1001 that includes a dedicated voltage divider block for converting the line high voltage to voltage levels compatible with electronic logic components. This off-voltage sensing component 1001 is utilized to aid in a fault detection operation during the OFF-TIME of the pulse power being transmitted on the transmission line 102. This off-voltage sensing component 1001 also expands the OFF-TIME voltage and "clips off" the ON TIME voltages.

The circuit 1000 includes a touch threshold comparator 1002 configured to compare this off-transition sensing voltage from the off-voltage sensing component 1001 to a predetermined threshold, $V_T$. The output from the touch threshold comparator 1002 is a logic level "high" when the input is above the threshold $V_T$. The output is coupled to a logic latch 1003, such that at the end of the OFF-TIME the logic latch 1003 creates a logic level "low" latched signal if the transmission line 102 is in an unsafe condition, e.g., line touch detected. The circuit 1000 is held at a logic level "high" (i.e., safe) when the line voltage is below a predetermined Safe to touch voltage level (e.g., sag 60V) as detected by the VMINOK signal (e.g., Voltage Minimum OK is equivalent to 60V).

The circuit 1000 includes a disconnect threshold comparator 1004 configured to compare the off-transition sensing voltage from the off-voltage sensing component 1001 to a predefined threshold, $V_C$. The output from the disconnect threshold comparator 1004 will be a logic 'low' when the input voltage is above the $V_C$, and a logic 'high' when the input voltage is below $V_C$. The output from the disconnect threshold comparator 1004 is then latched at the end of the OFF-TIME by a logic latch 1005. If the transmission line 102 is detected to being disconnected from the load (Converter), the latch output will be held at a logic "low" (i.e., not ready/disconnected). Otherwise, the latch output will be held at a logic "high" (ready/connected). Therefore, the circuit 1000 is held at a logic "high" level (i.e., safe) when the Line voltage is below safe to touch (e.g., sag 60V) as detected by the VMINOK signal.

Figure 11:
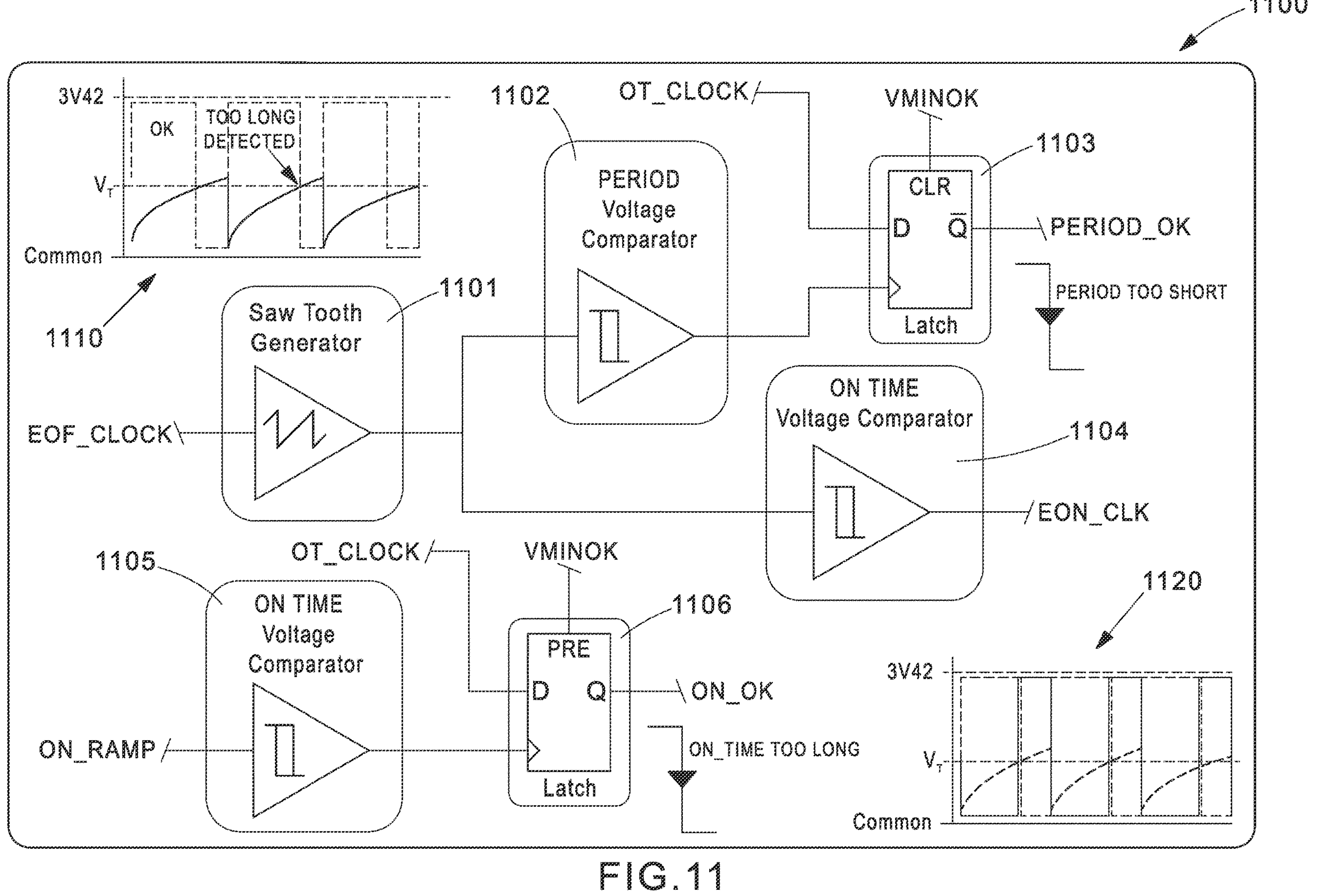
FIG. 11 illustrates a circuit diagram of an exemplary circuit that may be included in the pulse power delivery system for detecting a length of signal periods that may indicate a fault condition, according to some embodiments.

FIG. 11 illustrates an exemplary circuit diagram of circuit 1100 that may be included in the pulser modules 112. The circuit 1100 includes components and/or mechanisms utilized to generate a signal that indicates when the ON-TIME is too long at the end of one period that is used in different parts of the safety detection circuit. While the described embodiments are described as measuring both the ON-TIME and OFF-TIME as a periods, other embodiments where a period is measured from ON-TIME to subsequent ON-TIME (e.g., measured from rising edge of ON-TIME to rising edge of subsequent ON-TIME) are also considered.

The circuit 1100 includes a saw tooth generator 1101 that is triggered by the End of OFF TIME Clock Generator and configured to discharge an RC circuit at the end of the OFF-TIME period. The voltage level of the output from the saw tooth generator 1101 reflects the time into the total period. The circuit 1100 also includes a Period exceeds max threshold detector 1103 configured to transition to a "Low" logic level when the Period is too short (e.g., an issue in the system clock causing a longer pulse period).

The circuit 1100 also includes an ON-TIME exceeds max threshold detector 1105 that is triggered by a Ramp signal generated by the ON-Time RC circuit. The detector 1105 is configured to transition to a "high" logic level when the input voltage exceeds a predefined threshold, $V_T$, which corresponds to an excessive ON-TIME duration. An output of the detector 1105 is coupled to a logic latch 1106, where the logic latch 1106 is configured to hold the logic latch 1106 at the "high" logic level (i.e., safe) when the Line voltage is below 60V as detected by the VMINOK signal. The detection may represent an over voltage condition on transmission line 102 due to the possibility of an increased duty cycle. In all cases the detection represents a system timing error, in which case the logic latch 1106 may be configured to hold the circuit 1100 at the "low" logic level (i.e., fault detected).

The circuit 1100 also includes an End of ON-TIME Clock Generator 1104 configured to create a positive edge at near the end of the ON-TIME period.

Figure 12:
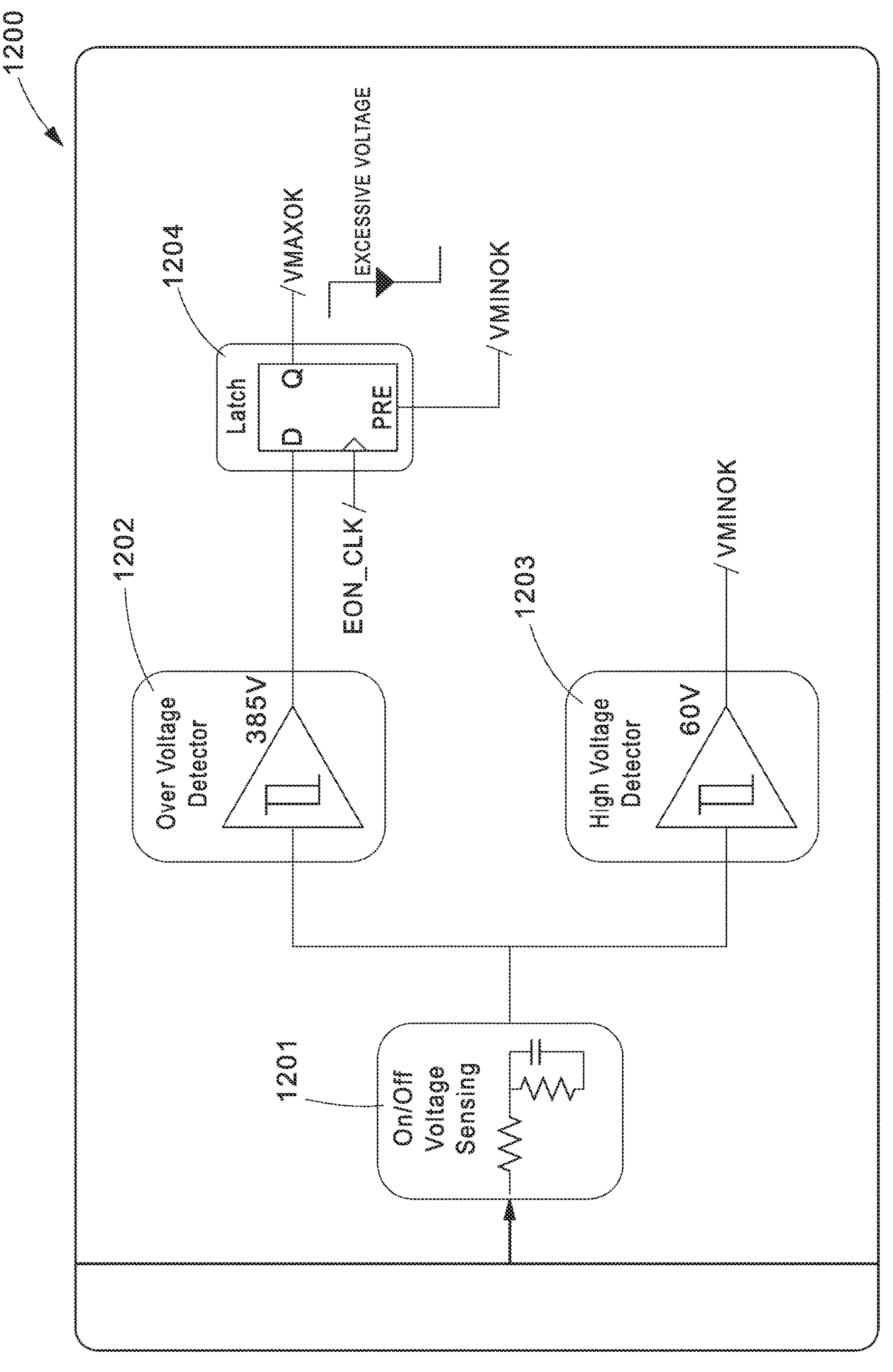
FIG. 12 illustrates a circuit diagram of an exemplary circuit that may be included in the pulse power delivery system for detecting voltage levels, according to some embodiments.

FIG. 12 illustrates an exemplary circuit diagram of a circuit 1200 that includes components and/or mechanisms utilized to generate a signal that indicates when a line voltage exit maximum allowed voltage is present on the line and a signal that indicates line voltage is exiting safe to touch voltage (e.g., 60V). This circuit 1200 may be used in different parts of the safety detection circuit included in the pulse power delivery system 100.

The circuit 1200 includes an On/Off voltage Transition Sensing component 1201 that includes a dedicated voltage divider block configured to convert the line high voltage to voltage levels compatible with electronic logic components (e.g., 3.3V, or approximately 3.3V).

The circuit 1200 also includes an Over Voltage Detection component 1202 configured to go low when the line voltage is above a maximum allowed voltage (e.g., 385 V, or approximately 385 V). The output from the Over Voltage Detection component 1202 is latched to a logic latch 1204 at the end of the ON-TIME period to generate a logic "low" signal when this condition occurs. The circuit is held at a "high" logic level (i.e., safe) when the line voltage is below 60V as detected by the VMINOK signal.

The circuit also includes a High Voltage Detector component 1203 configured to go "high" when the Line voltage exceeds safe to touch voltage (e.g., sag 60V) to enable the safety detection circuitry. This circuit 1200 remains active during OFF-TIME periods that occur after an ON-TIME period that exceeds the safe to touch voltage (e.g, 60V).

Figure 13:
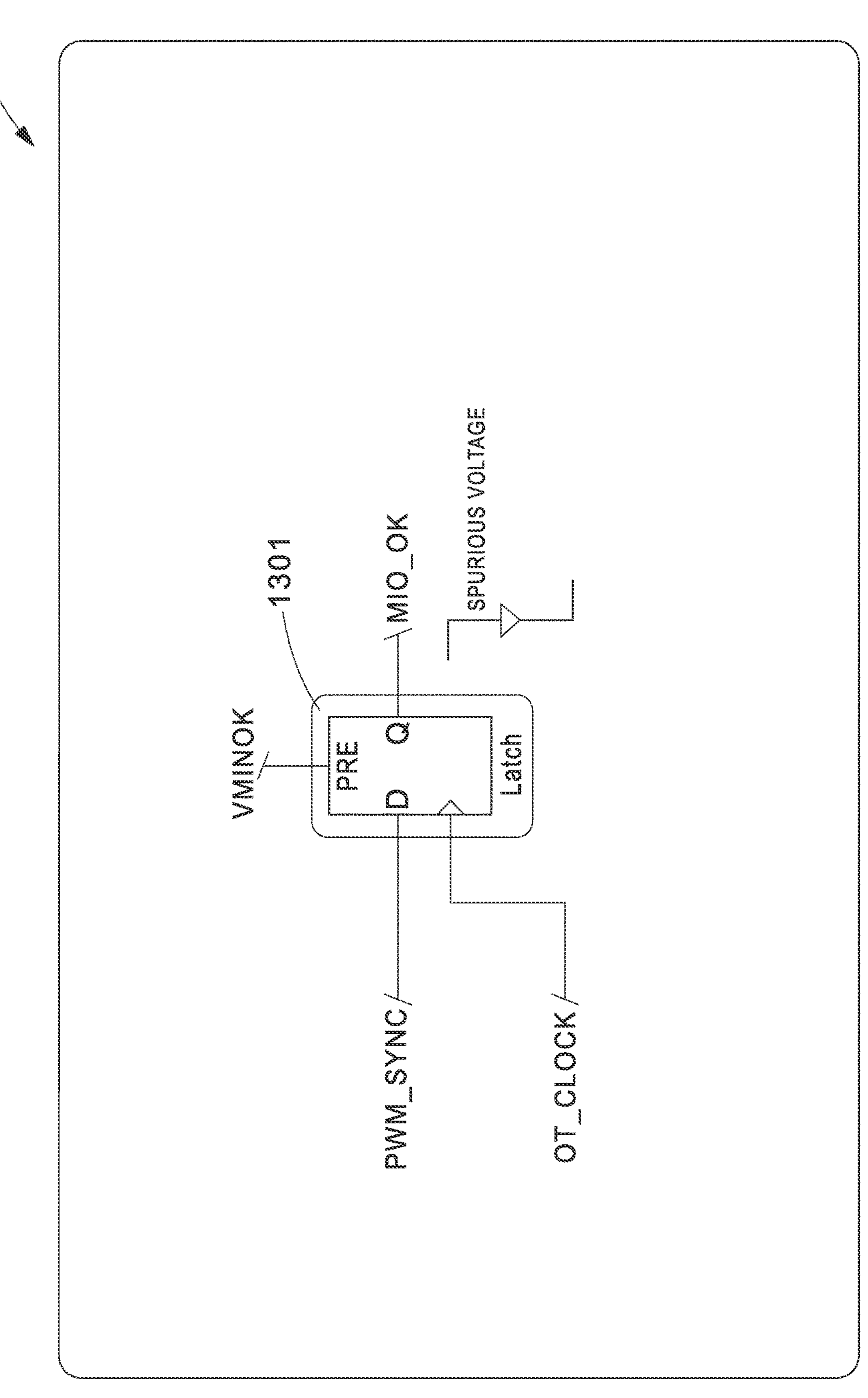
FIG. 13 illustrates a circuit diagram of an exemplary circuit that may be included in the pulse power delivery system for detecting a spurious voltage that may indicate a fault condition, according to some embodiments.

FIG. 13 illustrates an exemplary circuit diagram of a circuit 1300 that may be included in the pulse power pulser module 112.

The circuit 1300 includes a Matched IO (MIO_OK) detector latch 1301 that latches the level of the main timing PWM signal generated by the control system at the beginning of the ON TIME as detected from the transmission line 102. If the main timing PWM signal is not high when transmission line 102 is detected as going high the output from the latch 1301 will go low indicating a fault.

Figure 14:
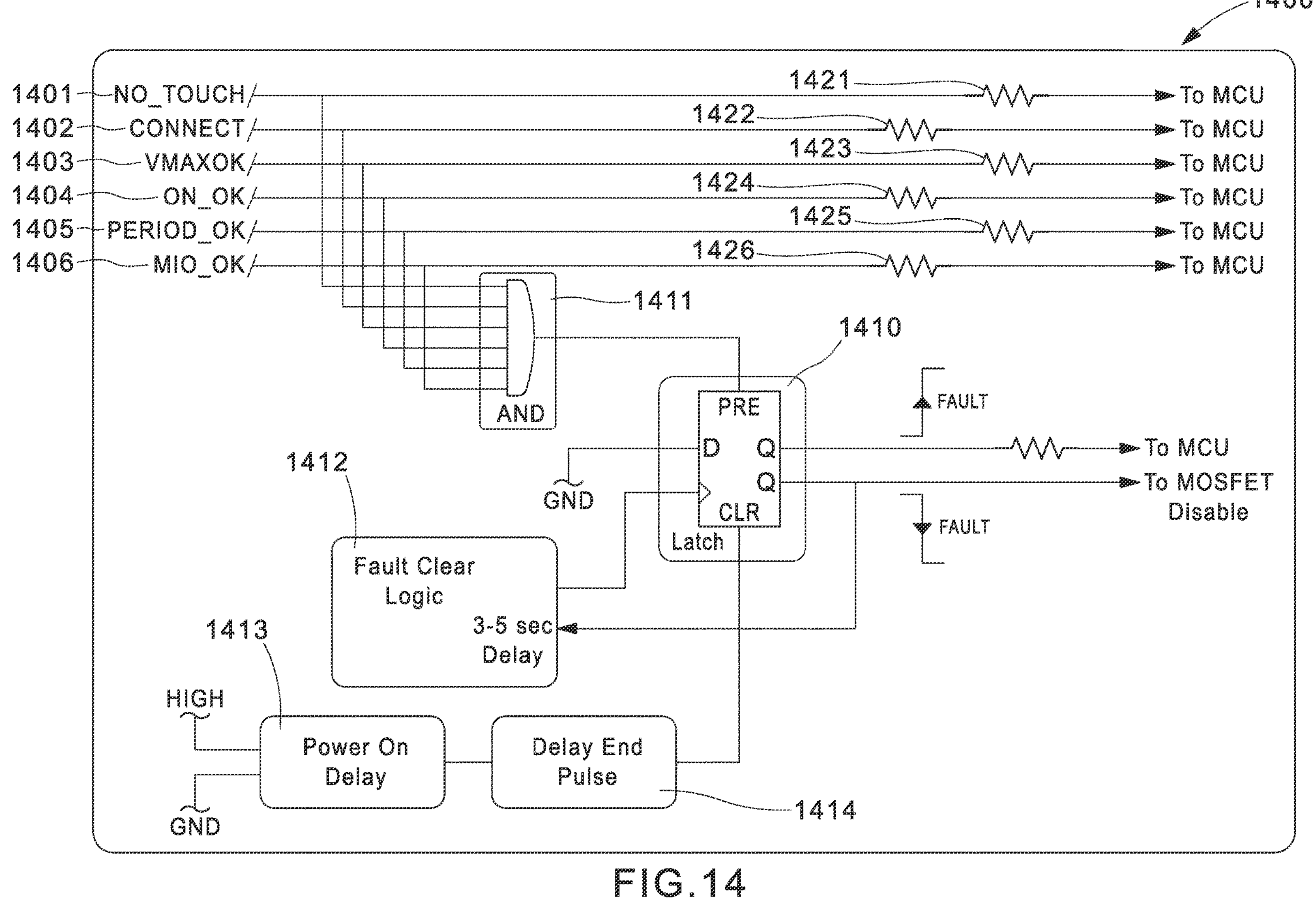
FIG. 14 illustrates a circuit diagram of an exemplary circuit that may be included in the pulse power delivery system for routing detected fault signals within the pulse power delivery system, according to some embodiments.

FIG. 14 illustrates an exemplary circuit diagram of a circuit 1400 including circuitry and the corresponding integrations of fault signals analyzed by the redundant circuits in the pulser module 112.

As discussed, the pulser modules 112 may be configured to generate the following fault detection signals as shown in FIG. 14: NO_TOUCH signal 1401, CONNECT signal 1402, VMAXOK signal 1403, ON_OK signal 1404, PERIOD_OK signal 1405, and MIO_OK signal 1406. One or more of these six fault detection signals will go low when an un-safe condition is detected. The un-safe condition forces the output of the latch 1410 to go low, which disables a respective Switch and transmit a "high" signal to the MCUs.

Each of the detection signals also go to the MCUs through their respective resistors 1421-1426 for error reporting. The resistors 1421-1426 are large enough that the MCU cannot alter the logic level presented at the inputs to the AND component 1411. The activation of the latch 1410 starts a 3~5 second delay in a Fault Clear Logic 1412. This output will clock the latch 1410 and if all the detection signals go "high" (i.e., in-active state) the fault condition will clear. While any detection signal is active, the fault condition will remain.

The circuit 1400 also includes a Power-On Delay component 1413 configured to block force a momentary clearing of the latch 1410 on power up. A Fault Reset Switch may also manually force a clear signal to the latch 1410. The circuit 1400 also includes a delay end pulse component 1414 which is configured to convert the Power-On Delay signal into a pulse rather than a continuous logic high or low signal.

These described circuits are fully redundant, meaning they may be duplicated.

Signal Shaping

In the power electronics field, switching high voltage signals On and Off into power-transmission lines to control current or voltage may be applied in certain implementations of packet-based power transmission application (i.e., NEC Class 4 Power supply), which is the solutions offered by the pulse power delivery system 100. Here the voltage is turned on and off in a certain fixed interval. The OFF-TIME may be used to detect the status of the power transmission line 102.

The base rate of switching the power between the ON-TIME and the OFF-TIME may be in the low frequency range, however, depending on the period, the slope of the transition and amplitude of the switched voltage, there is the chance for the introduction of high frequency spectrum/harmonics. This phenomenon is best understood as a Fourier spectrum representation of a trapezoidal clock signal.

The power-transmission lines often are selected based on the rated current capacity and rated voltage level, hence, the impedance of cables is not necessarily matched with the High Frequency (HF) impedance of the source and HF impedance of the load. The HF impedance of the source and load are characterized as power source impedance and power load impedance at the transition time. If the HF impedance creates a mismatch with the power transmission line, it may generate reflections. As illustrated in the exemplary power system 1510 of FIG. 15, a reflected signal in a power transmission line can travel back and forth many times between a power source 1511 and a powered sink 1512 (i.e., load) until it gets attenuated, which is an unwanted occurrence on the transmission line.

Figure 15:
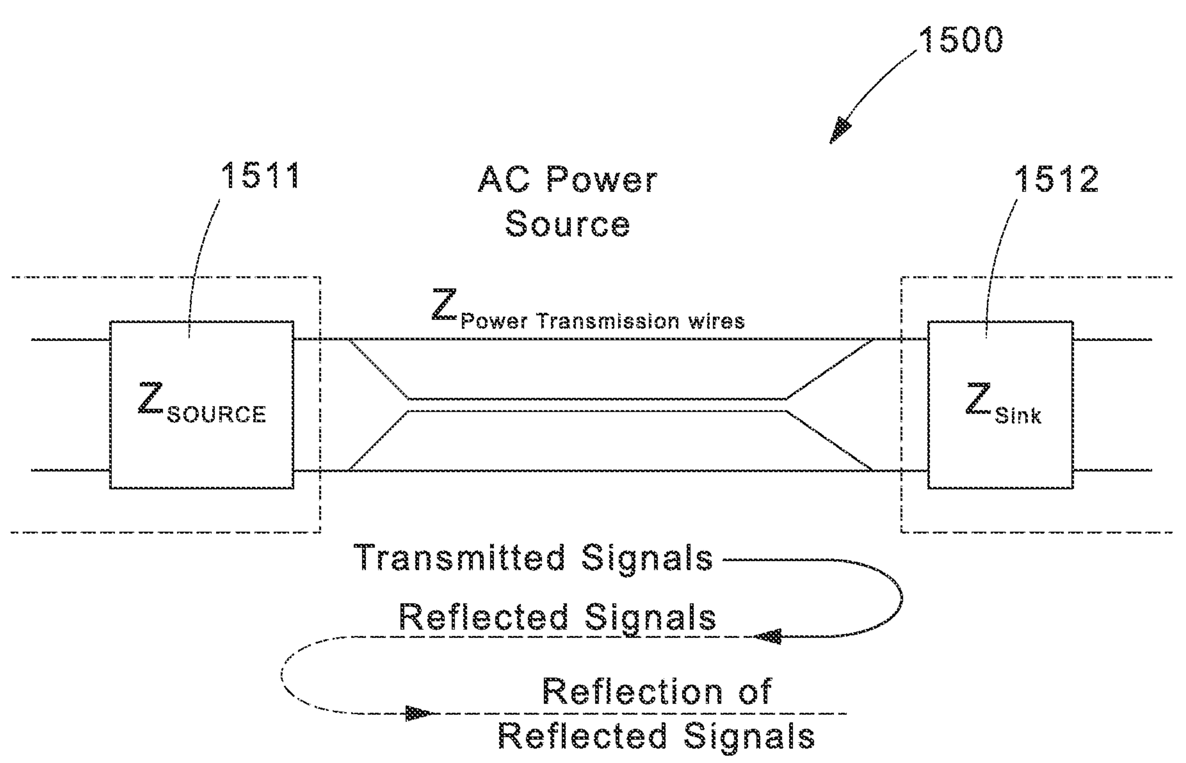
FIG. 15 illustrates an exemplary system diagram and exemplary pulse power signal that may be generated by the pulse power delivery system, according to some embodiments.
Figure 15:
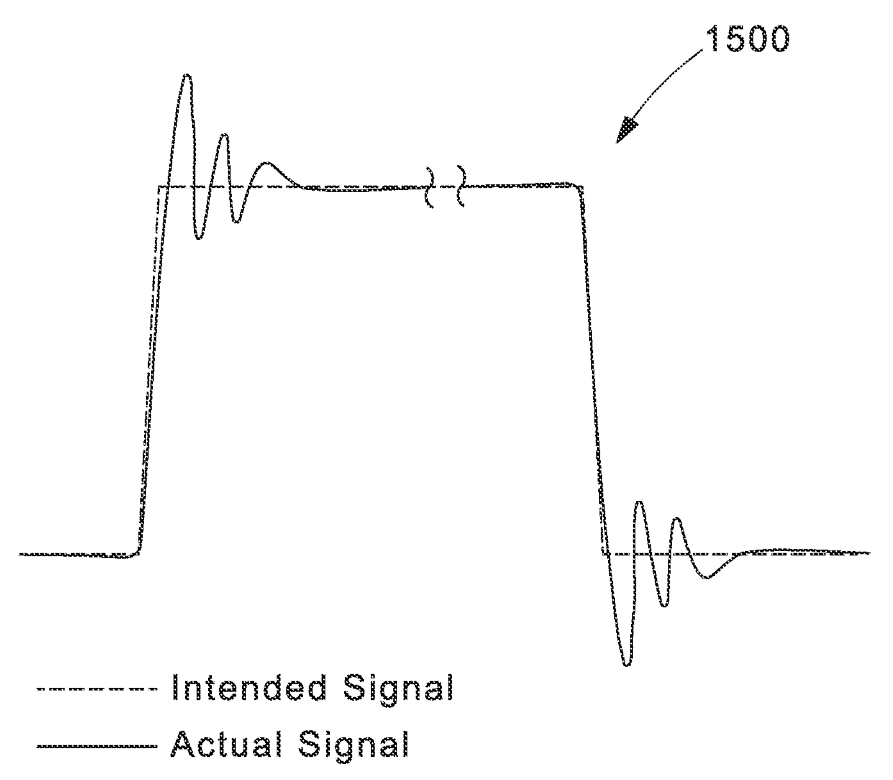

FIG. 15 also includes a corresponding exemplary pulse power signal 1520 that outlines the intended pulse signal in the dashed line, and also superimposes the unwanted signal reflections that may actually result from the power system 1510 in the solid line. Reflections like this manifest themselves as ringing, standing waves and overshoot, as exemplified in the pulse power signal 1520. This can result in high voltage spikes that can have damaging effects on the installed equipment and/or create EMI/EMC issues. As illustrated by the pulse power signal 1520, the actual signal propagating on the power transmission line has ringing and overshoot at the transition times and defers from the intended (ideal) signal. The reflected signal's propagation time over the power transmission line dictates the frequency content forming the ripple signal.

Being described herein is a signal smoothing solution that eliminates, or at least significantly reduces, this overshoot phenomenon and hence reduces the unwanted negative effects resulting from it. Although the signal smoothing solution is described as being applied to a pulse power signal produced by the pulse power delivery system 100, it may be applied more generally to other systems and different applications, such as for example motor control, that may or may not utilize pulse power.

Reduction of the high frequency components of the switched signal and/or decreasing the switched signal's high order harmonics can be accomplished by the alteration of the switched signal's slope (e.g., rise and fall time) at the transition time. The concept is realized utilizing a pulsing control signal technique (see e.g., FIG. 17A) to control the slope of the transition without additional power loss. This will be implemented by generating a much higher rate switching-control-signal with a varying duty cycle at the transition times combined with a smoothing circuit at the output of the switcher. The higher rate of the switching-control-signal can be implemented in terms of variable frequency with a varying duty cycle.

Figure 16:
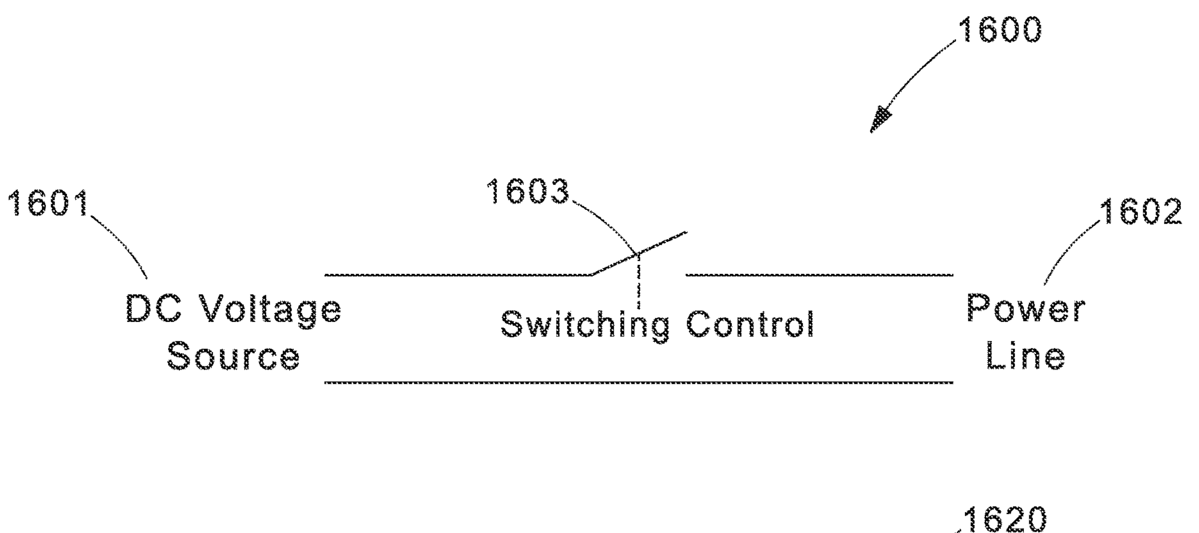
FIG. 16 illustrates an exemplary system diagram of a switching control system that may be utilized in the pulse power delivery system, according to some embodiments.
Figure 16:
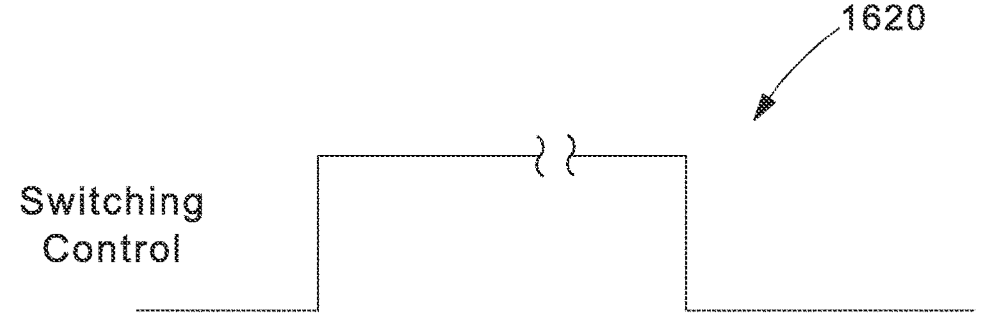
Figure 16:
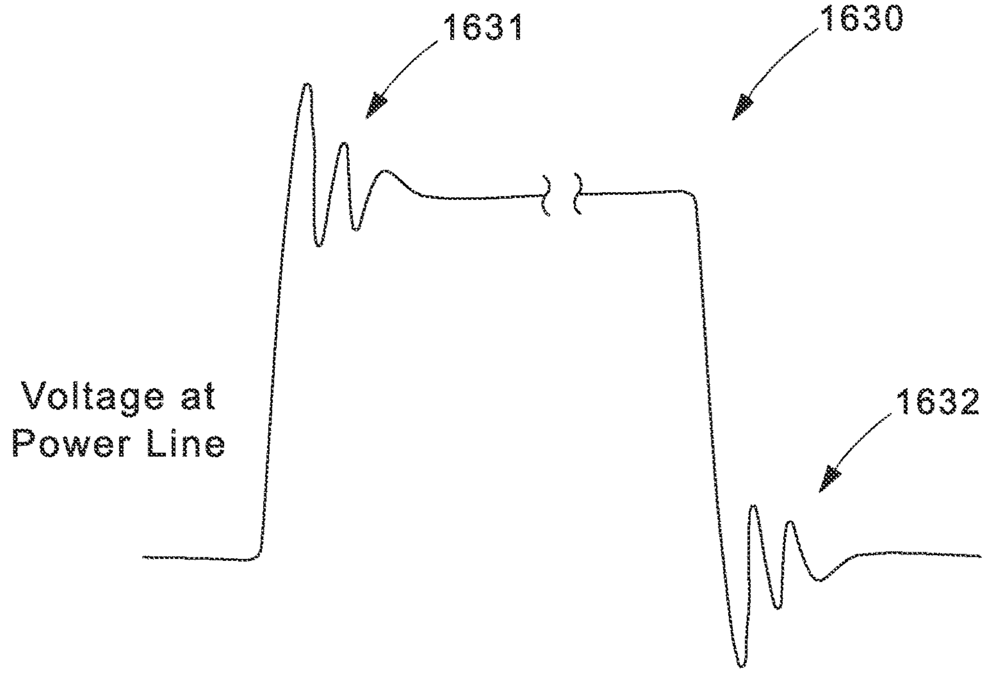

FIG. 16 illustrates an exemplary simplified system diagram of a switching control system 1600 for producing pulse power, where the switching control system generates a switching power signal that may result in a ripple and/or an overshoot (hereinafter may be referred to as signal defects) on the power transmission lines at the transition intervals. The switching control system 1600 includes a switching control component 1603 that is placed on a power transmission line 1602 being supplied by a DC voltage source 1601. Also included in FIG. 16 is an exemplary control signal 1620 that demonstrates the timing of the control signal 1620 for controlling the opening and closing of the switching control component 1603. Also included in FIG. 16 is an exemplary voltage power signal 1630 resulting from the switching control system 1600, where the voltage power signal 1630 is shown to include the unwanted signal defects 1631, 1632 at the pulse start (see signal defect 1631) and the pulse down (see signal defect 1631).

Figure 17A:
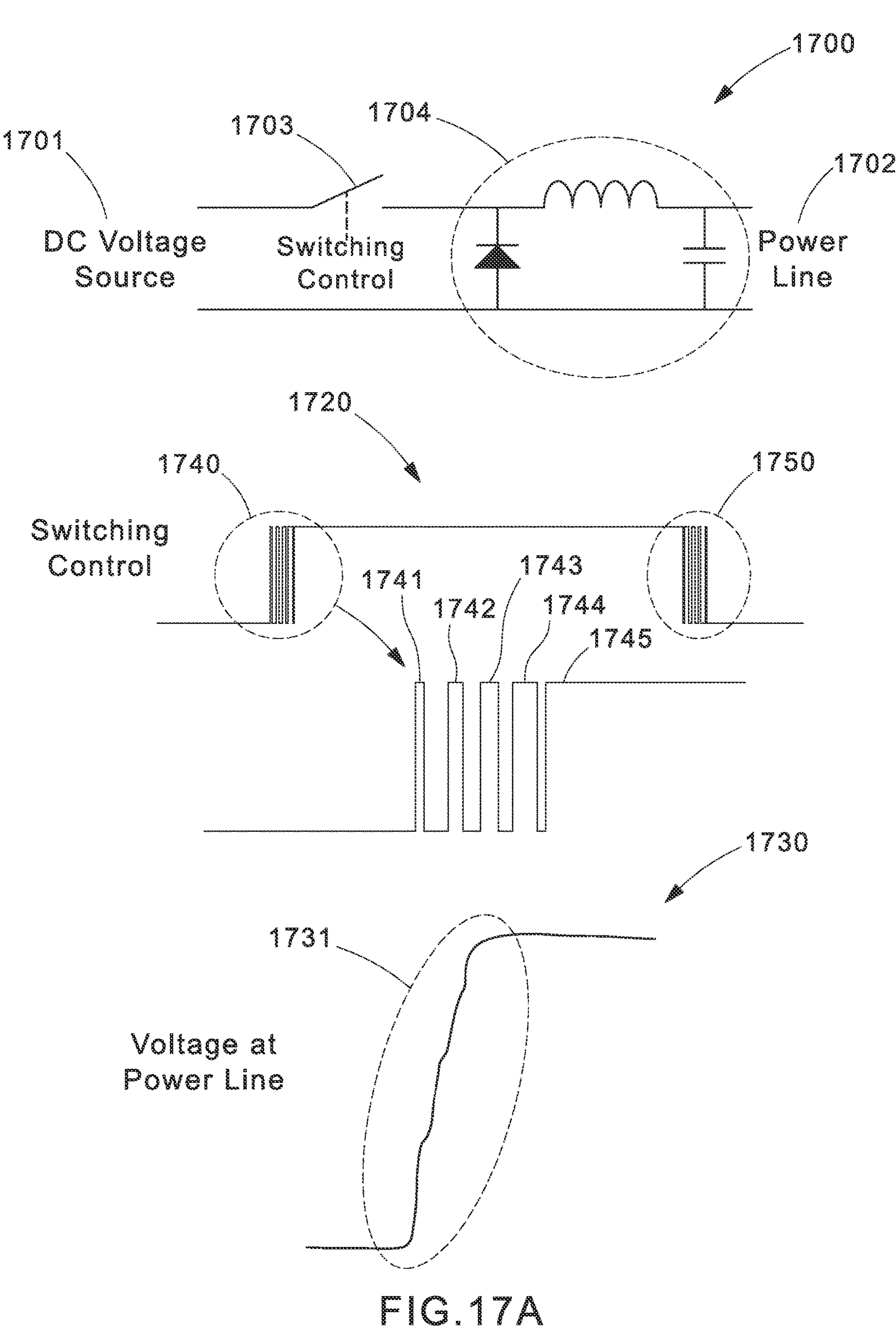
FIG. 17A illustrates an exemplary system diagram of a switching control system that may be utilized in the pulse power delivery system for applying a signal shaping solution to address signal defects, as well as an exemplary signal diagram of a corrected pulse power signal, according to some embodiments.

FIG. 17A illustrates an exemplary system diagram of a switching control system 1700 that now includes a smoothing circuit 1704 according to the current solution. The switching control system 1700 includes a switching control component 1703 that is placed on a power transmission line 1702 being supplied by a DC voltage source 1701. In addition to these power pulsing components, the switching control system 1700 additionally includes the smoothing circuit 1704 (i.e., High-voltage Integrator). Unlike the earlier described pulse power signal 1520 that was simply turned high then low for controlling the pulse power period, the smoothing circuit 1704 is configured to control the switching control signal 1720 so that the switching control signal 1720 itself is pulsed a number of times (e.g., a predetermined number of times) on the rise and fall of the switching control signal 1720. This is implemented by pulsing the switching control component 1703 a number of times at the rising edge 1740, and pulsing the switching control component 1703 a number of times at the falling edge 1750. This results in modulating or shaping the rising and failing edges/portion of the overall switching control signal 1720 that is the active power signal 1745 being shortened. For example, the overall switching control signal 1720 may be HIGH, or have an ON-TIME, for a temporal length of approximately 2 ms, with the rising edge 1740 being approximately 50 μs and the falling edge being approximately 50 μs of that time. Therefore, in this embodiment, the signal smoothing on the rising edge and falling edge comprises 5% or less of the overall pulse, with each being 2.5% or less of the overall pulse.

The length of time during which the pulses are implemented in the rising edge 1740 and/or the falling edge 1750 may be adjusted to be longer, or shorter (e.g., a predetermined length of time). For example, the time during which the pulses are implemented in the rising edge 1740 and/or the falling edge 1750 may be adjusted to a longer, or a shorter, amount of time (e.g., a predetermined amount of time) based on external factors such as the known physical characteristics of the transmission line cable.

As seen in the magnified view of the rising edge 1740 portion in the switching control signal 1720, the rising edge 1740 includes a number of individual pulses 1741-1744. Although four pulses 1741-1744 are shown, in alternative embodiments the number of pulses may be greater, or fewer, than those shown in FIG. 17A. Furthermore, each subsequent pulse 1741-1744 may be slightly longer in temporal length as shown in FIG. 17A, or alternatively each pulse 1741-1744 may be equal in temporal length. The pulses in the falling edge 1750 may be reflective of the pulses in the rising edge 1740. Although both the rising edge 1740 and the falling edge 1750 are shown to include pulses, according to some embodiments the pulses may only be included in one of the rising edge 1740 or the falling edge 1750. Also, although the pulses in the rising edge 1740 are shown to last for approximately the same amount of time as the pulses in the falling edge 1750, according to some embodiments the pulses may last for different amounts of time. For example, the rising edge 1740 may last for a period of time, or a number of pulses, that is less than, or greater than, a period of time, or a number of pulses, of the falling edge 1750.

As shown by the voltage signal 1730 in FIG. 17A, the voltage signal 1730 resulting from the signal shaping/smoothing solution has a much smoother rising edge, free of the ripple and/or an overshoot signal defects 1631 found in voltage power signal 1630.

The different embodiments of the switching control signal 1720 being controlled by the smoothing circuit 1704 may be adjusted according to the known physical characteristics of the transmission line cable. It follows that the current solution of the smoothing circuit 1704 may detect a type of cable, including one or more cable attributes, and select a particular signal shaping solution to match the detected cable type. The cable type may be detected based on a load characteristic of the cable, and the selected signal shaping solution will be optimized for the particular type of load characteristic of the cable. The cable attributes may also be input by a user so that the pulser modules 112 determines the optimum signal shaping solution based on the cable attributes received.

Figure 17B:
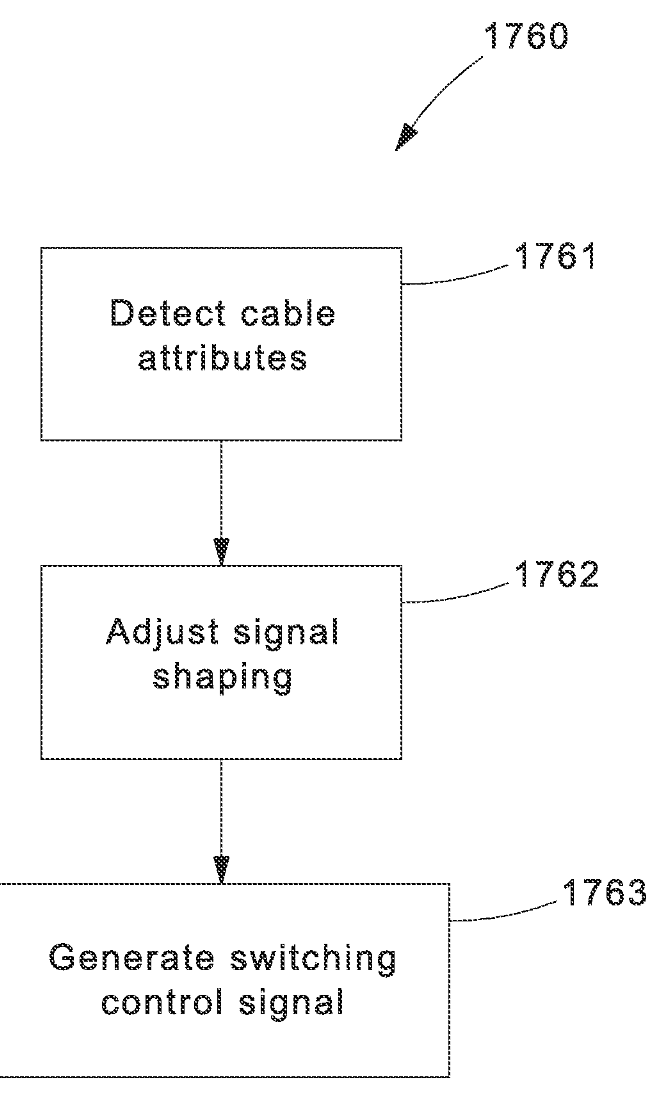
FIG. 17B illustrates an exemplary flow diagram of a signal shaping solution implemented on a pulse power signal by the switching control system shown in FIG. 17A, according to some embodiments.

FIG. 17B shows an exemplary flow diagram 1760 describing a process for implementing the signal shaping solution described herein. The process may be implemented, for example, by the pulser module 112 included in the pulse power delivery system 100.

At 1761, cable attributes of the cable used as the transmission line 102 are gathered. The cable attributes may be gathered according to any of the methods described herein. For example, the cable attributes may be detected based on a load characteristic of the cable that can be determined following a load detection test conducted on the transmission line 102. The cable attributes may be manually input to the pulse power delivery system 100. The cable attributes may be looked-up from a database, where a user inputs the cable identification, and the pulse power delivery system 100 looks up the cable identification in a database storing cables and their respective attributes. Then when a match is found from the database, the corresponding cable attributes may be obtained. The cable attributes may include one or more of the following: characteristic impedance, capacitance, inductance, DC impedance, AC impedance, or other measurable cable attribute.

At 1762, the pulser modules 112 may select a tailored signal shaping solution based on the cable attributes detected earlier. In this way, the signal shaping to the switching control signal may be adjusted to fit the particular cable being used as the transmission line 102. The adjustments may be according to any one or more of the adjustments described herein. Alternatively, a default signal shaping may be chosen when cable attributes are not specifically detected, or when the default signal shaping is selected to be applied.

At 1763, the switching control signal selected from earlier at step 1762 is generated and applied to the switching control component in the pulse power delivery system 100.

RF Data Link Over a High-Voltage Pair of Conductors

Pulse Current (i.e., Fault managed power distribution) is a method for transmitting and delivering high power (e.g., Class 4) in a more efficient and safe manner, where power is instantaneously turned off in case of fault (e.g., cable distribution). Pulse current (PC) is a direct current that is non-contiguous, where the direct current is chopped up into ON/OFF intervals and a fault condition is tested in each interval before the other pulse can be transmitted. PC power may be transmitted over a pair of copper conductors, same as in DC power. When a fault is detected on the transmission line, a pulse power delivery system (e.g., the pulse power delivery system 100) may be configured such that the pulse is controlled to immediately stop. This makes the copper conductor safe to touch, which simplifies installation regulations (e.g., no cable conduit is needed, doesn't require certified electrician, etc.), and also reduces deployment time and cost.

Further, unlike AC power, PC power allows centralized power management and distribution, power metering, power backup without the need for cable conduit. Compared to Class 2 DC power (e.g., ESLV Power Supplies, PoE, etc.), PC power is a high voltage Class 4 power (e.g., up to 400V DC) that delivers more power over much longer distance while also having the benefit of using a thinner copper conductor. Some of the benefits of using the thinner copper conductor may include weight savings, cost savings, footprint savings, easier to install, to mention some benefits to thinner wire.

As described, the pulse power delivery system 100 provides Class 4 PC power by pulsing a high voltage DC (i.e., 300V~600V) on and off for a predefined pulse duration repeatedly in a periodic fashion. Before another high voltage pulse is transmitted, fully redundant and independent fault detection circuitries that utilize discrete hardware will check the transmission line 102 for one or more fault incidents, including, but not necessarily limited to: cable touch or short, cable disconnect, undervoltage, overvoltage, pulse timing skew, or presence of unsafe voltage during the OFF-TIME.

In addition to the features already described above, the pulse power delivery system 100 may also include features to super impose a low data rate communication signal onto the same transmission line 102 to provide a solution for system management, control, and data reporting for a scalable and manageable PC power distribution system. To implement these features, various techniques and methods may be integrated together to provide an RF (radio frequency) communication link over a high voltage single pair cable for PC applications such as the pulse power delivery system 100.

Figure 18:
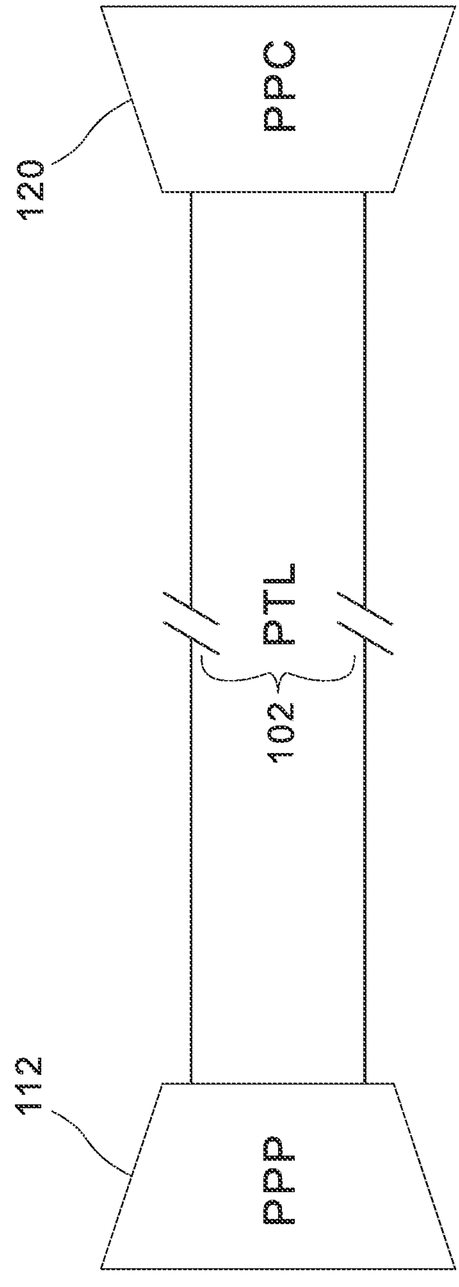
FIG. 18 illustrates an exemplary system diagram of the pulse power delivery system in a line-to-line topology, according to some embodiments.

FIG. 18 shows another depiction of the pulse power delivery system 100, where in FIG. 18 the pulser module 112 is shown transmitting the pulse power signal over the transmission line 102 to the pulse power convertor 120. The pulse power delivery system 100 may include up to 12 pulser modules 112 transmitting over 12 PPP channels over 12 single pair transmission lines 102 in a point-to-point fashion. This enclosed system may be expanded to connect with more enclosed systems under a centralized management point.

Figure 19:
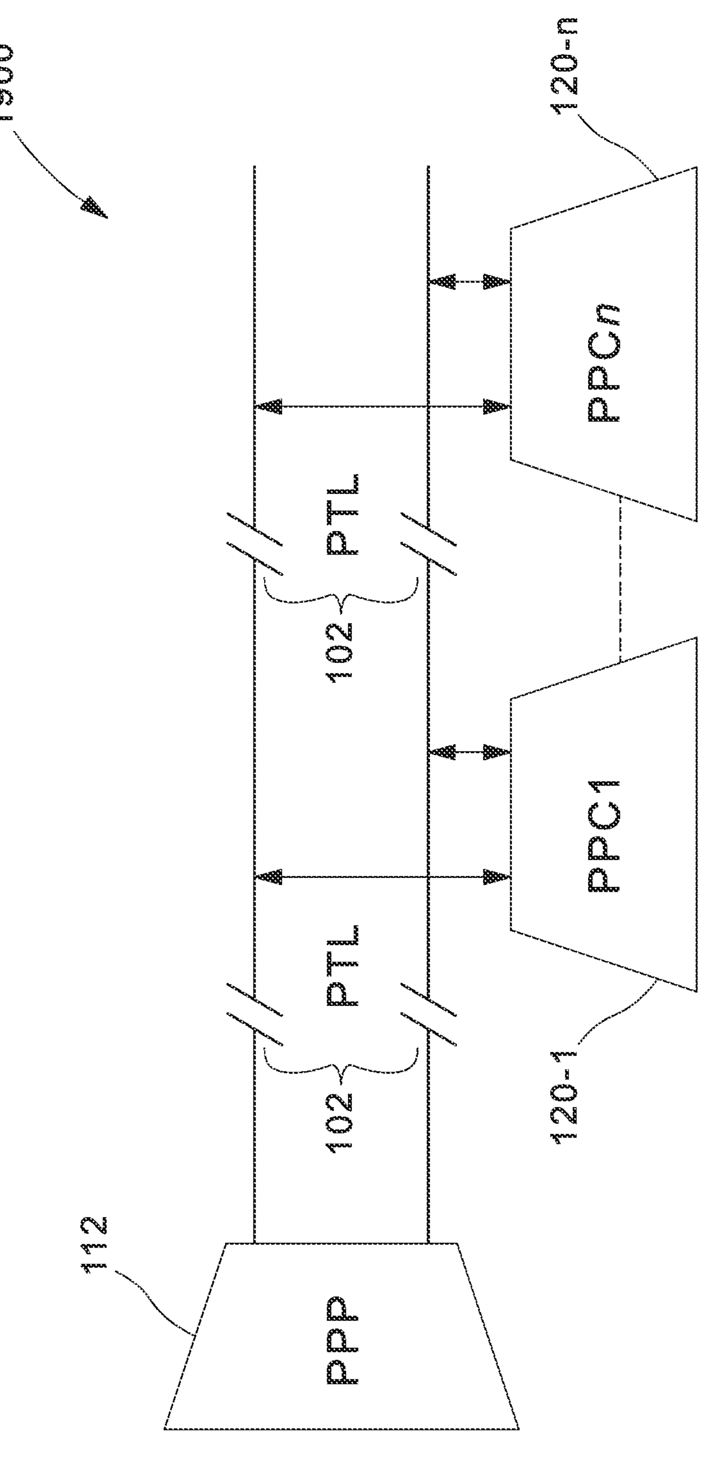
FIG. 19 illustrates an exemplary system diagram of the pulse power delivery system in a daisy-chain topology, according to some embodiments.

FIG. 19 shows an exemplary pulse power delivery system 1900 that builds upon the architecture of the pulse power delivery system 100. The interconnection between the pulser module 112 and the pulse power converter 120 may not be limited to the point-to-point connection topology as provided in the pulse power delivery system 100 shown in FIG. 18, but may also be modified to couple multiple pulse power convertors 120 in a daisy-chain topology as shown in FIG. 19. In the exemplary pulse power delivery system 1900, a single pulser module 112 is configured to drive up to n PPC (Pulse Power Converter) channels to connect to n number of pulse power convertors 120-1 to 120-*n*, where n is an integer of 1 or greater. This is made possible by daisy chaining the n number of pulse power converters 120-1 to 120-*n* to the common transmission line 102. Each PPC channel is addressed with a unique address that is assigned at the startup of the pulse power delivery system 1900 over an RF communication link.

Figure 20:
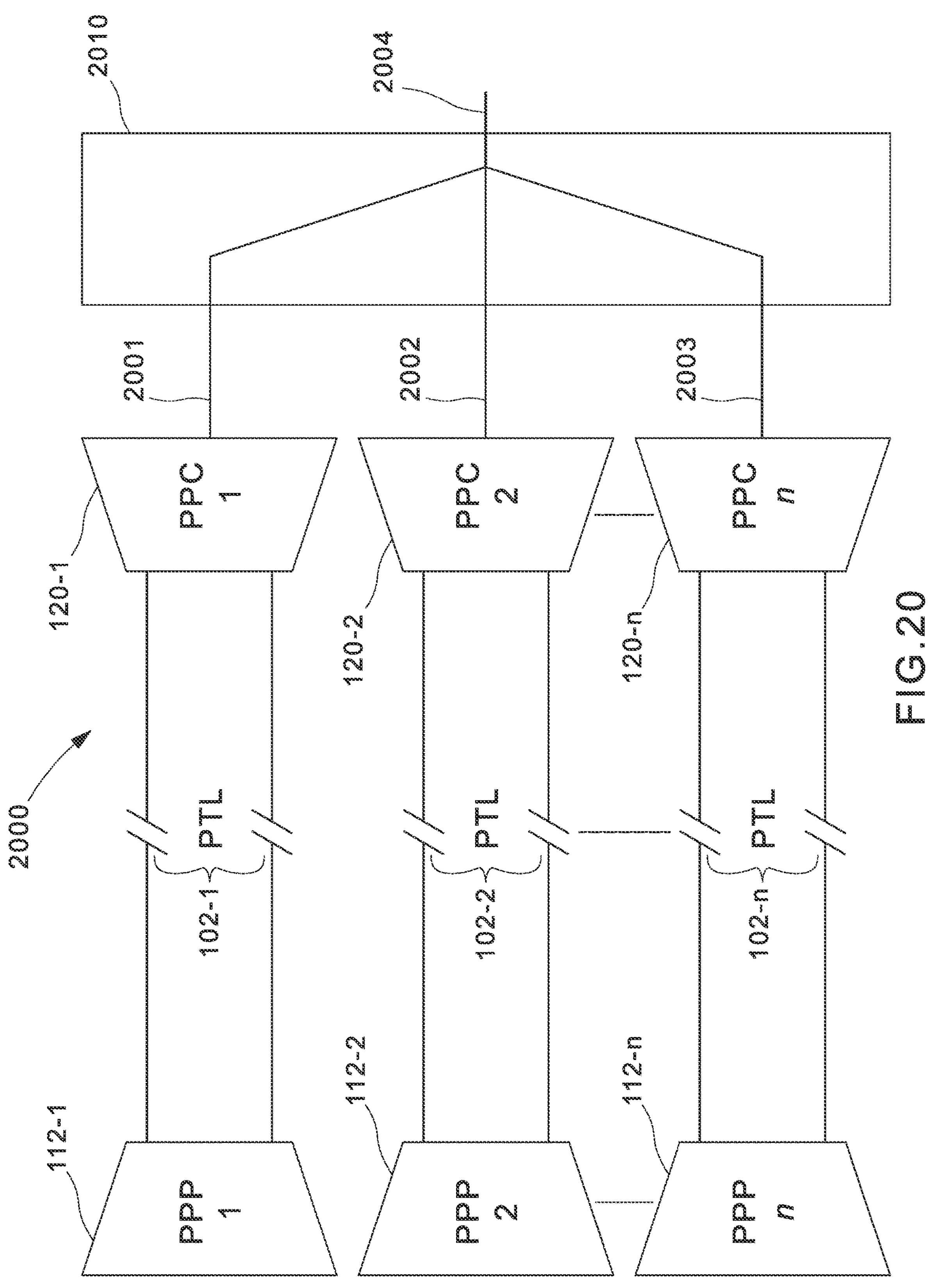
FIG. 20 illustrates an exemplary system diagram of the pulse power delivery system in a combination topology where the outputs from multiple pulse power converters are combined, according to some embodiments.

FIG. 20 shows another exemplary pulse power delivery system 2000 that builds upon the architecture of the pulse power delivery system 100, where the pulse power delivery system 2000 supports several PPC channels 2001, 2002, 2003 that are the outputs from the plurality of unique pulse power convertors 120-1, 120-2, 120-*n*, where n is an integer of 1 or greater. Each of the pulse power convertors 120-1, 120-2, 120-*n* are supplied their own pulse power signal from a respective pulser module 112-1, 112-2, 112-*n*. The PPC channels 2001, 2002, 2003 are combined into a combined output signal 2004 to support a higher output power. To accomplish the combining of multiple PPC channels 2001, 2002, 2003, the pulse power delivery system 2000 includes an integrated power combiner circuit 2010 that employs n-controlled output switches, n reverse current/polarity blocking/protection controllers, n load sharing controllers, and a sophisticated load startup algorithm. A load device is then configured to connect to the combined output signal 2004.

Figure 21:
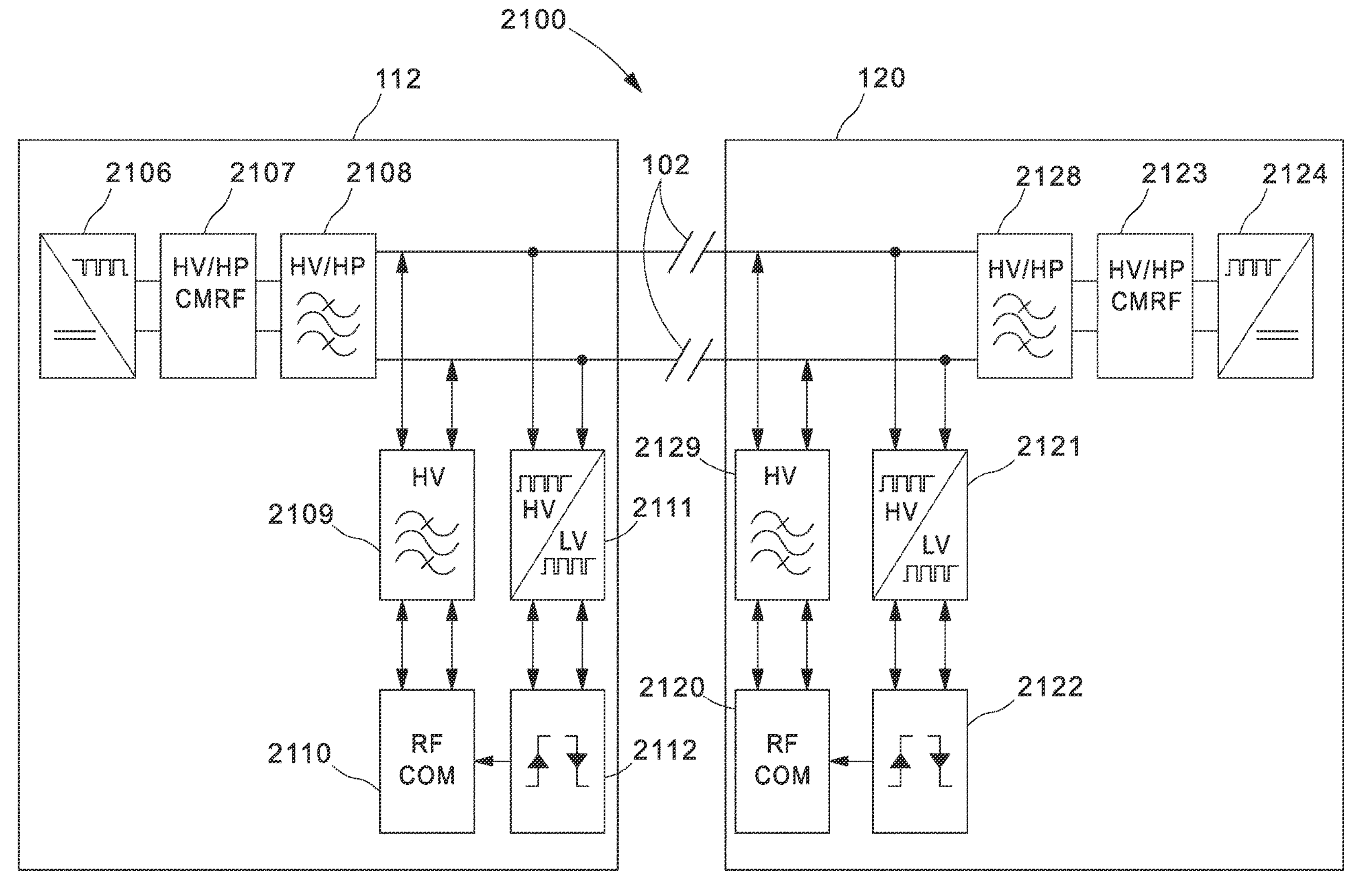
FIG. 21 illustrates an exemplary system diagram of the pulse power delivery system showing RF communication link components that are involved when a single pulser module is coupled to a single pulse power converter, according to some embodiments.

FIG. 21 shows a system architecture of an exemplary single channel pulse power system 2100 where the pulser module 112 is directly coupled to the pulse power converter 120 over the single channel transmission line 102, according to some embodiments. This architecture shown in FIG. 21 incorporates the essential sub-systems that super impose the high-voltage power and RF communication data over the transmission line 102.

The pulser module 112 includes a pulser component 2106 (e.g., may be representative of a pulser module and power supply combined), where the pulser component 2106 is configured to take the high-voltage DC power (e.g., ±150V~±200V) and chop it up into ON/OFF intervals (e.g., 2 ms ON/1 ms OFF) to produce a train of pulse power on the transmission line 102. The output of this block is governed by the redundant safety circuitry described herein (e.g., safety circuitry 400).

The train generated by the pulser component 2106 is fed into a high-voltage/high-power common-mode rejection filter (CMRF) 2107. The CMRF 2107 provides close to zero attenuation at the pulse power switching frequency (e.g., 333 Hz) and transitions to a higher attenuation over a wide-band at higher frequencies. The CMRF 2107 is configured to have a peak attenuation of 50 dB at the RF communication carrier frequency. This CMRF 2107 is utilized to prevent any in-band switching harmonics from intermodulating with the modulated RF signal.

The output of the CMRF 2107 is fed into a high-voltage/high-power, very narrow-band, resonance band-stop filter (BSF) 2108. The BSF 2108 is constructed of high-power and high voltage resonance inductors and capacitors to provide very high characteristic impedance (notch) at the RF communication carrier frequency and very low impedance otherwise. Without this BSF 2108, the RF signal would be shunted by electromagnetic interference (EMI) and bulk caps to the left of the BSF 2108.

The RF communication signal is a half-duplex signal transmission modulated and demodulated in an RF communication unit 2110. The input and output of the RF communication unit 2110 is a differential signal that connects to a differential, high-voltage, wide-band, resonance band-pass filter (BPF) 2109. The BPF 2109 is constructed of high-power and high voltage resonance inductors and X1Y1 capacitors that are used to provide 3 KV reinformed isolation barrier between the primary circuit (HV) and secondary circuit (LV) and to block the DC component such that only the low-voltage, high frequency components in the filter band can be seen by the RF communication unit 2110 RF front-end. Detailed system architecture for the RF communication unit 2110 is depicted in FIG. 21.

Circuitry component 2111 and circuitry component 2112 provide the synchronization signal for the RF communication unit 2110 data modulator/coder and demodulator/encoder. The high-voltage pulse current (PC) is first converted into a low-voltage over a resistive network. An X1Y1 capacitor is used to provide 3 KV reinformed isolation between the primary circuit (HV) and secondary circuit (LV) within the circuitry component 2111. The low-voltage, isolated signal at the output of the circuitry component 2111 represents a logic-level pulse signal that is used to generate a reference signal for the rising and falling edges in the circuitry component 2112 and feeds into the RF communication unit 2110.

This RF communication signal at 1 MHz carrier frequency is super imposed into the 333 Hz HV Pulse Current at the transmission line 102. The 1 MHz carrier frequency was experimentally selected as the average cable insertion loss up to 1 MHz is acceptable to compensate up to 50 dB attenuation resulted from 2 KM long cable, and in the same time be far away from power switching frequency harmonics that are dominate under 800 KHz.

The PPC in the transmission line 102 utilizes same architecture/elements for the BSF 2128, the RF communication unit 2120, the circuitry component 2121, and the circuitry component 2122 included in the pulse power converter 120. A high-voltage/high-power common-mode rejection filter (CMRF) 2123 provides close to zero attenuation at the PP switching frequency (i.e., 333 Hz) and transitions to a higher attenuation over a wide-band at higher frequencies and around the harmonics of the DC-DC phase-shift converter switching frequency in the converter circuitry component 2124. The CMRF 2123 was designed to have a peak attenuation of 50 dB at the RF communication carrier frequency. This CMRF 2123 is important to prevent any in-band switching harmonics generated by the converter circuitry component 2124 from intermodulation with the RF signal. The converter circuitry component 2124 converts the PC into DC voltage that feeds the DC bus of the phase-shift, full-bridge DC-DC converter. The output of the converter circuitry component 2124 is fed into the load device (e.g., load device 523). In this way, the RF communication unit 2110 may communicate on the transmission line 102 to be synched to the periods of the pulse power signal by using, among other circuitry components, band-stop and bandpass filters.

Figure 22:
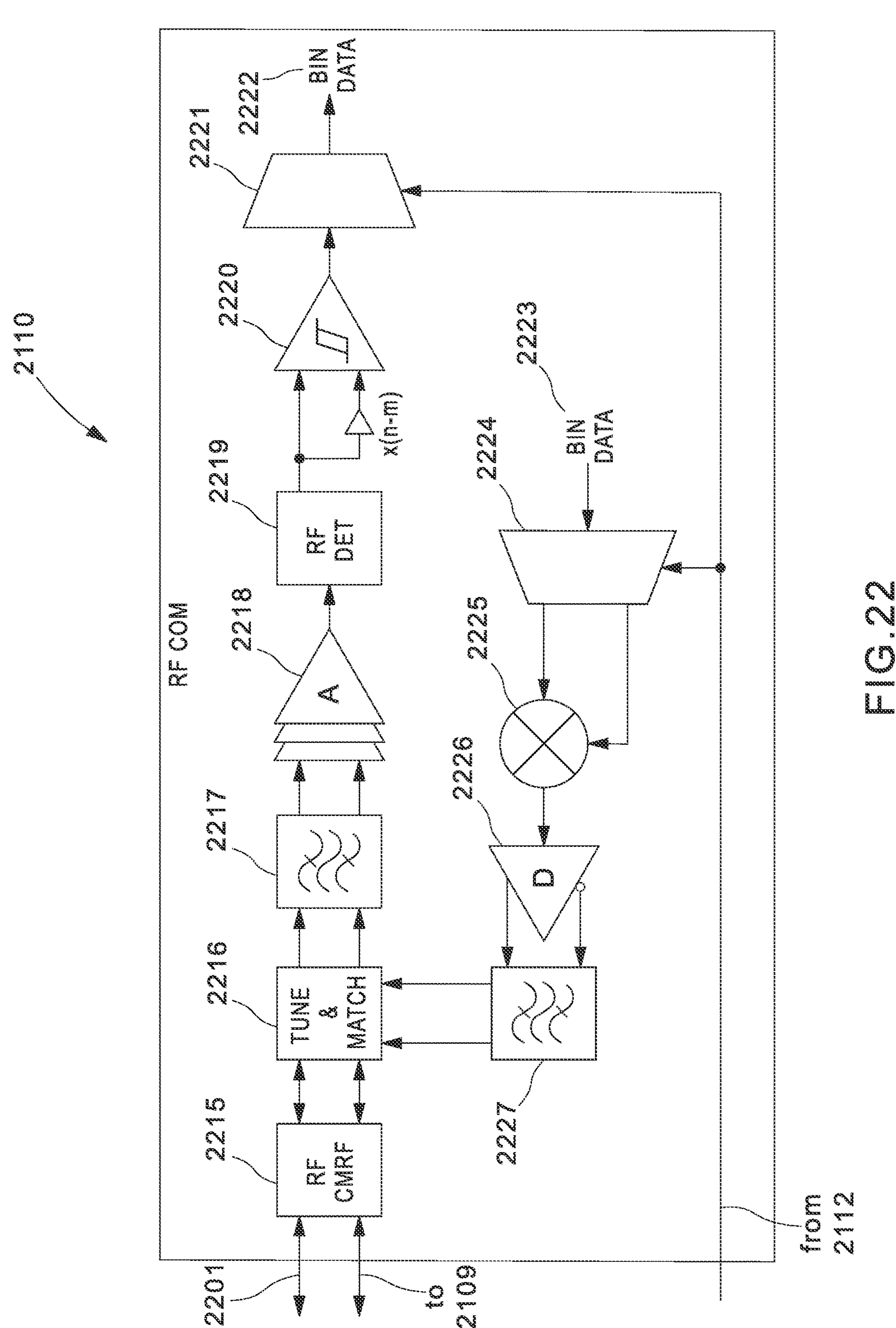
FIG. 22 illustrates an exemplary system diagram of an RF communication unit included in the pulser module as well as the pulse power converter shown in FIG. 21, according to some embodiments.

As mentioned, FIG. 22 illustrates a more detailed system diagram of the components comprising the RF communication unit 2110 sub-system. The RF communication unit 2110 connects with BPF 2109 using bidirectional communication through a differential RF front-end 2201. A current compensated common-mode rejection filter (CMRF) 2215 blocks the common-mode interference caused by the high-power DC-DC switching converter from getting into the differential RF front-end 2201. It is designed to provide 10KΩ~15KΩ common-mode impedance and close to zero differential impedance over the RF communication band.

The RF communication unit 2110 also includes an impedance matching network 2216 that can be tuned to match the transmission line impedance depending on the characteristic impedance of the cable used in the transmission line 102 and the number of multi-drop points connected on the bus in a daisy-chain use case. The impedance matching network 2216 also includes an RF limiter and provides capacitive coupling between the CMRF 2215 and a band-pass filter (BPF) 2217.

The BPF 2217 may be an 8th order Butterworth-Bessel 0.5, 200 kHz passband, 1 MHz center frequency, active band-pass filter that is designed to form 40~48 dB in-band attenuation to remove any frequency components that are outside the RF communication signal band over the full range of signal strength (i.e., ±5 mV to ±200 mV). The BPF 2217 may be designed to have less than 220 u Vrms noise, 800*n* V/√Hz spectral noise density at 1 MHz, <7 us group delay, and a fast step response.

The RF communication unit 2110 may also include an amplifier 2218, where the amplifier 2218 may be a multi-stage, fully differential input, demodulating logarithmic amplifier that has a very fast voltage mode output. The amplifier 2218 may use a successive detection technique to provide a very high dynamic range. The unique integration of this stage and all the filtering at the front-end allows the pulse power delivery system 100 to provide a demodulated output with up to 50 dB of insertion loss on the cable of the transmission line 102. The single-ended, output from the amplifier 2218 is fed into an RF detector 2219, where the RF detector 2219 is used to generate a demodulated output represented as an envelope of the input signal after the amplification.

The demodulated signal from the RF detector 2219 is fed into a self-biased discriminator 2220 that includes a time varying delay to provide dynamic reference to the non-inverting input of the comparator in the pulse power delivery system 100. The output of the discriminator 2220 is a digitized signal that is fed into a synchronous decoder 2221 that employs a bit-banging algorithm to decode the received data. The decoded data is analyzed and stored afterwards in a memory storage device 2222 (e.g., memory units that may comprise a database).

For data transmission, the binary data is fed from the memory storage device 2223 (e.g., the memory storage device 2223 may be the same, or different, from the memory storage device 2222) to an encoder/modulator 2224. The encoder/modulator 2224 encodes the binary data from the memory storage device 2223 and generates the corresponding baseband frequency (fm) and a carrier frequency (fc) in a digital form. The two outputs from the encoder/modulator 2224 are synchronized to the rising edge of the pulse reference signal received from the circuitry component 2112 before they are fed into a digital inter-modulator 2225. The output of the digital inter-modulator 2225 is fed next into a uni-directional, differential digital line driver 2226.

The RF communication unit 2110 may also include a differential, high-Q, resonance band-pass filter (BPF) 2227. This BPF 2227 has a narrow band that is tuned to the modulated frequency band. The output of the BPF 2227 is a balanced, CW modulated RF signal that connects to the impedance matching network 2216. The driving impedance of the transmitter will impose the impedance of the impedance matching network 2216 during data transmission cycles. Meaning, the driving impedance is always fixed and lower than the detection impedance in listening mode. Once the transmission cycle is complete, the line driver will be disabled and the RF communication unit 2110 will be set back to the detection mode impedance (i.e., listening mode).

Figure 23:
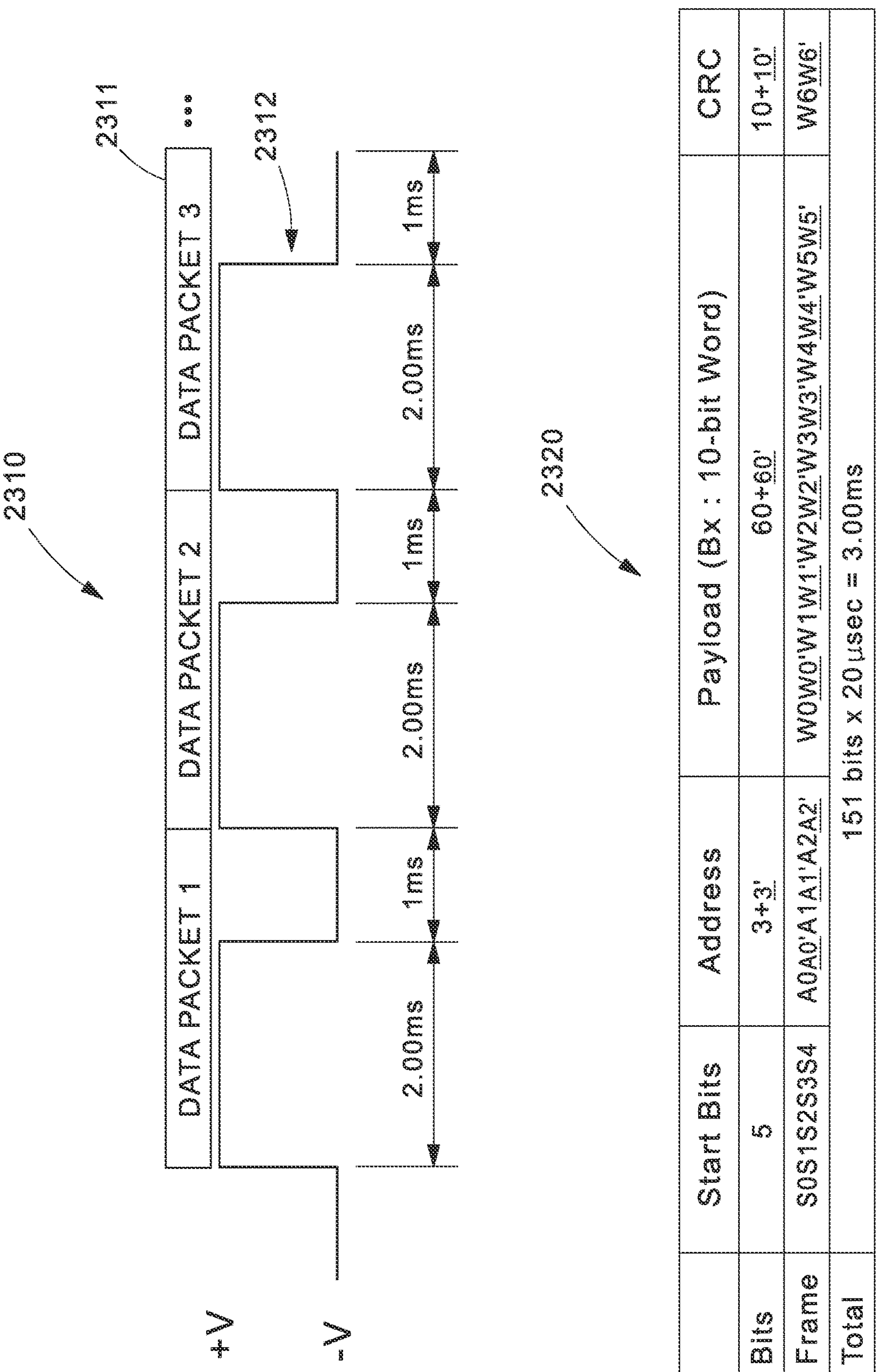
FIG. 23 illustrates an exemplary data packet structure and an exemplary timing graph for transmitting the data packet structure, according to some embodiments.

FIG. 23 illustrates an exemplary timing graph 2310 showing the timing of the periodic pulse power signal 2312 and the transmission of data packets in a data signal 2311 over the RF communication link. FIG. 23 also illustrates an exemplary data packet 2302 that may be included as part of the data signal 2311 being transmitted over the RF communication link on the transmission line 102. The data encoding by the encoder/modulator 2224 and the data decoding by the decoder 2221 may be implemented to generate the fixed data packet 2302 as shown in FIG. 23 as follows:

START BITs: Provide a known power-transmission-line (PTL) status and initial identification.

ADRESS BITs: Identity the remote node in both point-to-point or multi-drop communication link.

Payload: Transmitted Data.

CRC: Data Transmission error-detection.

In the encoding/modulating implemented by the encoder/modulator 24, the data 8-bit words are mapped to 10-bit symbols to achieve DC balance and bounded disparity, and at the same time provide enough state changes to allow reasonable clock recovery.

Depending on the characteristic impedance of the cable, whether it's more inductive or capacitive, the ON/OFF transition on the transmission line 102 can create a very low impedance state that shunts the RF signal during that transition for very short time, which will alter the 'high' logic to become 'low' logic for couple bits. This issue is resolved by the present solution by inserting an image of the 10-bit mapped symbols after each 10-bit symbols to provide a simple yet effective way of providing error correction to the data packet 2320. The image portions of the data bits are depicted in the data packet 2320 by the underline and prime notation.

The decoding/demodulating stage operated by the decoder 2221, will parse the data and cross each 10-bit symbols with their respective image for error correction. Even if all the bits in the word are altered, the original word can still be recovered. The worst-case scenario occurs when the last 5 bits of the 10-bit symbols and the first 5 bits of the 10-bit symbols image are altered. Yet even in this scenario the original data can still be recovered as the last 5 bits of the 10-bit symbols image are still not altered and can be used to correct the last 5 bits of the 10-bit symbols. This scheme allows bit error correction for an alternation of up to 10 bits. Now if more than 10 bits (i.e., the full word) are corrupted, then the CRC will detect this error and a data re-transmission will be requested to ensure corrupted data is not mistakenly used.

The length of the payload can be adjusted based on the ON/OFF Interval. In the data packet 2320 shown in FIG. 23 the data packet structure is for a 2.00 ms ON-Time period and a 1 ms OFF-Time period. In this case, the payload can fit 120 bits that represent 6 data bytes mapped to 10-bit symbols with their corresponding images.

Whether in a point-to-point topology (see e.g., FIG. 18) and/or daisy-chain topology (see e.g., FIG. 19), the pulse power delivery system 100 is only utilizing a single pulser module 112 that switches ON/OFF causing bits alternation to deal with for data error correction. However, when multiple pulser modules 112 are shared for a multi-wire pair cable (e.g., three-pair cable), the crosstalk (e.g., crosstalk due to capacitive coupling) between the pairs may also alter the RF signal during the ON/OFF transition. This becomes a complex problem if the ON/OFF transition of the multiple pulser modules 112 are asynchronous, which can result in more than 10 bits being corrupted, and hence, can't be restored.

To overcome this issue, a master clock may be included to provide synchronization between the pulser modules 112 utilizing the same multi-pair cable. In these cases, each pulser module 112 is assigned a slot number. Then based on the slot number, the pulser module 112 will add a phase shift to the master clock to create a trigger for generating the pulse current (PC) to reference the output of the pulser component 2106 for each pulser module 112.

Figure 24:
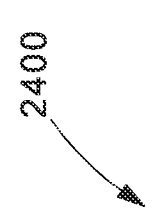
FIG. 24 illustrates a timing graph describing an exemplary synchronization strategy when operating three pulser modules, according to some embodiments.
Figure 24:
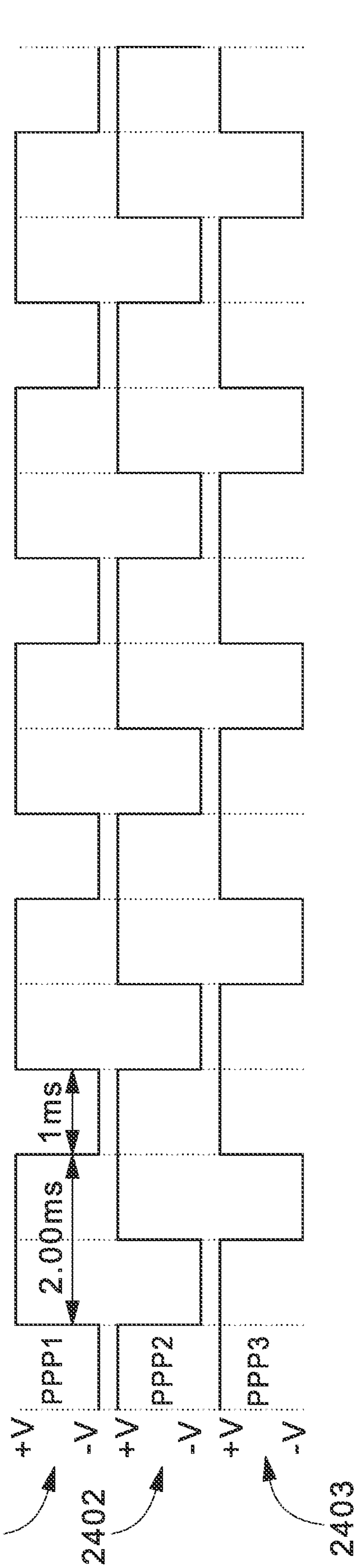

FIG. 24 shows an exemplary timing graph 2400 that depicts three pulse current signals (PC signals) 2401, 2402, 2403 at the transmission line 102, with each of the PC current signals 2401-2403 being generated by a first pulser module 241, a second pulsar module, and a third pulsar module, respectively. The timing graph 2400 shown in FIG. 24 depicts a scenario where the three pulser modules generating the three PC signals 2401, 2402, 2403 are synchronized. Each of the PC signals 2401, 2402, 2403 are phase shifted by 120 degrees from each other, which corresponds to a "1 ms delay x slot number" from the master clock. In this case, only two pulser modules are active at the same time (i.e., times when the pulser modules are at logic "high" at the same time). The ON/OFF transition is configured to happen every 1 ms.

Figure 25:
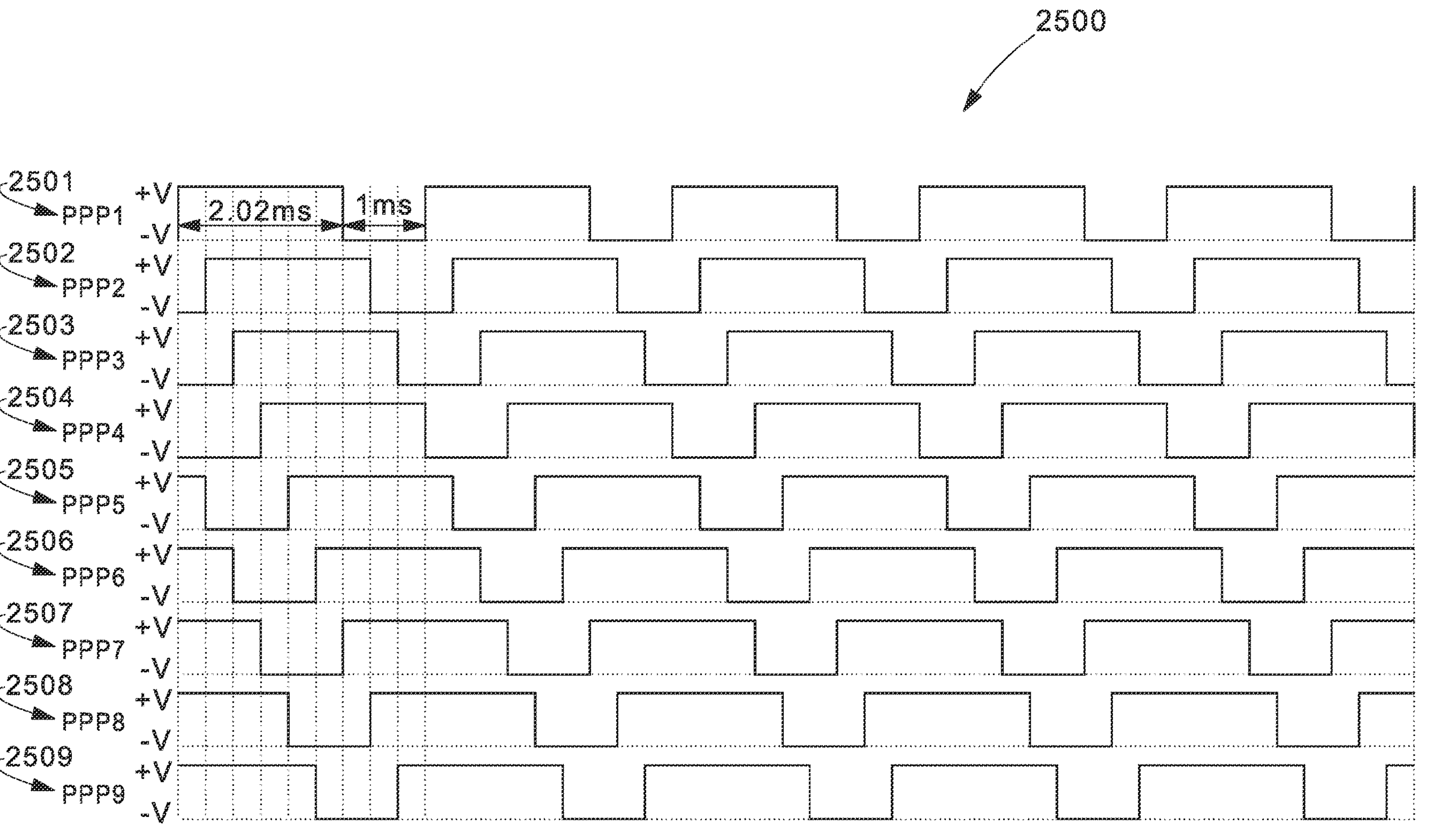
FIG. 25 illustrates a timing graph describing an exemplary synchronization strategy when operating nine pulser modules, according to some embodiments.

FIG. 25 shows an exemplary timing graph 2500 that depicts nine pulse current signals (PC signals) 2501-2509 at the transmission line 102, with each of the PC signals 2501-2509 being generated by respective pulsar modules. The nine PC signals 2501-2509 being generated by their respective pulsar modules are synchronized. For example, each of the nine PC signals 2501-2509 are phase shifted by 40 degrees from each other, which corresponds to a "0.333 ms delay x slot number" from the master clock. In this case, six pulser modules are active at the same time (i.e., times when the pulser modules are at logic "high" at the same time). The ON/OFF transition is shown to happen every 0.333 ms.

This synchronization strategy for ON/OFF Transition between the several pulser modules has other advantages that include reducing the stress on the main power source, reducing the EMI, and providing a steady power consumption at the system level. For example, utilizing the synchronization strategy minimizes, or at least reduces, the number of pulser modules 112 that need to be turned on at a same time, which in turn reduces the power draw from the power supply that would be demanded at the same time, which reduces the stress on the power supply. Although embodiments having three PC signals (see e.g., FIG. 24) and having nine PC signals (see e.g., FIG. 25), the synchronization strategy may be employed in other embodiments that include a different number of pulser modules generating PC signals for transmission on a multi-pair cable.

While the particular embodiments described herein have been shown and described, it will be obvious to those skilled in the art that changes and modifications may be made without departing from the teaching of the features described herein. For example, the pulse power delivery system may include different combinations of the components described herein and still be within the scope of this disclosure. Furthermore, although the fault detection, signal smoothing, or error detection features are described as being implemented on the pulser device, according to other embodiments the fault detection, signal smoothing, or error detection features may be implemented as a software-centric solution being executed by the management card. For example, the management card may include a memory storage device configured to store instructions for implementing the fault detection, signal smoothing, or error detection features described herein, as well as a processor for executing the instructions stored on the memory storage device to control the components of the pulse power delivery system to implement the fault detection, signal smoothing, or error detection features.

The matter set forth in the foregoing description and accompanying drawings is offered by way of illustration only and not as limitation. The actual scope is intended to be defined in the following claims when viewed in their proper perspective.

What is claimed is:

1. A high voltage power delivery system comprising:

a first pulser device configured to transmit a first pulse power signal included in a power transmission line according to a first slot assigned to the first pulser device;

a second pulser device configured to transmit a second pulse power signal included in the power transmission line according to a second slot assigned to the second pulser device, wherein the second pulse power signal is synchronized to the first pulse power signal;

a third pulser device configured to transmit a third pulse power signal included in the power transmission line according to a third slot assigned to the third pulser device, wherein the third pulse power signal is synchronized to the second pulse power signal; and a master clock configured to be referenced to implement the synchronization between the first pulser, the second pulser, and the third pulser by adding a first phase shift to the second pulse power signal with reference to the second slot and adding a second phase shift to the third pulse power signal with reference to the third slot, wherein the first phase shift and the second phase shift is determined based on a number of pulser devices transmitting on the power transmission line.

2. The high voltage power delivery system of claim 1, wherein the first phase shift is determined such that the second pulse power signal is synchronized to be 120 degrees shifted from the first pulse power signal.

3. The high voltage power delivery system of claim 1, wherein the second phase shift is determined such that the third pulse power signal is synchronized to be 120 degrees shifted from the second pulse power signal.

4. The high voltage power delivery system of claim 1, further comprising:

an RF communication unit configured to:

transmit a data packet stream over the power transmission line; and apply a bit error correction to the data packet stream as the data packet stream is transmitted over the power transmission line.

5. A high voltage power delivery system comprising:

an RF communication unit configured to:

transmit a data packet stream over a power transmission line, wherein the data packet stream includes a data packet comprising start bits, address bits, payload data, and error transmission bits, and wherein the transmission line is also configured to transmit a pulse power signal such that the data packet is transmitted to fit within a pulse cycle of the pulse power signal; and apply a bit error correction to the data packet stream by inserting error correction bits to mirror at least the error transmission bits in the data packet.

6. The high voltage power delivery system of claim 5, wherein the bit error correction comprises:

mapping, in the error transmission bits of the data packet included in the data packet stream, an 8-bit word into a 10-bit symbol;

inserting, in the data packet, a mirrored image of the 10-bit symbol in the form of the error correction bits;

parsing the data packet and crossing each 10-bit symbol with its respective mirrored image for error correction; and remapping each 10-bit symbol back into its 8-bit word to recover the 8-bit word from the data packet.

7. The high voltage power delivery system of claim 5, wherein a length of a payload portion in the data packet is adjustable during an ON/OFF interval of the pulse power signal being transmitted on the same transmission line as the data packet stream.

8. The high voltage power delivery system of claim 5, wherein a periodic length of the data packet is 3 ms to match the pulse cycle of the pulse power signal.

9. The high voltage power delivery system of claim 5, wherein the error transmission bits are further added to mirror the address bits and the payload data.

* * * * *